(12) United States Patent
Lee et al.

(10) Patent No.: US 12,514,057 B2
(45) Date of Patent: Dec. 30, 2025

(54) DISPLAY PANEL INCLUDING A METAL DUMMY STACK ARRANGED AT BOTH SIDES OF EACH OF A PLURALITY OF GROOVES

(71) Applicant: Samsung Display Co., Ltd., Yongin-Si (KR)

(72) Inventors: Jeongho Lee, Yongin-si (KR); Swaehyun Kim, Yongin-si (KR); Youhan Moon, Yongin-si (KR); Zail Lhee, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 506 days.

(21) Appl. No.: 17/981,924

(22) Filed: Nov. 7, 2022

(65) Prior Publication Data

US 2023/0232653 A1    Jul. 20, 2023

(30) Foreign Application Priority Data

Jan. 14, 2022   (KR) ........................ 10-2022-0006174

(51) Int. Cl.
*H01L 29/08*         (2006.01)
*G09G 3/3233*        (2016.01)
(Continued)

(52) U.S. Cl.
CPC ......... *H10K 50/844* (2023.02); *G09G 3/3233* (2013.01); *H10K 59/1213* (2023.02);
(Continued)

(58) Field of Classification Search
CPC ...... H10K 50/844; H10K 59/50; H10K 59/65; H10K 59/1213; H10K 59/1216;
(Continued)

(56) References Cited

U.S. PATENT DOCUMENTS 11,251,401 B2    2/2022   Kim et al.
11,417,864 B2    8/2022   Choi et al.
(Continued)

FOREIGN PATENT DOCUMENTS

KR    10-2017-0096646 A    8/2017
KR    10-2020-0090595 A    7/2020
(Continued)

OTHER PUBLICATIONS

Cite the machine translation Choi W (WO-2020/054915-A1).*

*Primary Examiner* — Phuc T Dang
(74) *Attorney, Agent, or Firm* — Innovation Counsel LLP

(57) ABSTRACT

Provided is a display panel including a substrate including an opening, a display area surrounding the opening, and a middle area between the opening and the display area, a plurality of inorganic insulating layers arranged on the substrate, a first partition wall and a second partition wall arranged in the middle area and arranged in the display area in a direction toward the opening, and a plurality of grooves arranged in the middle area and exposing portions of the plurality of inorganic insulating layers, wherein each of the plurality of grooves includes a metal dummy stack arranged at both sides of each of the grooves based on a virtual vertical line passing through a center of the groove and including a plurality of metal layers.

22 Claims, 18 Drawing Sheets

(51) Int. Cl.
*H10K 50/844* (2023.01)
*H10K 59/121* (2023.01)
*H10K 59/40* (2023.01)
*H10K 59/65* (2023.01)
*H10K 59/88* (2023.01)

(52) U.S. Cl.
CPC ......... *H10K 59/1216* (2023.02); *H10K 59/40* (2023.02); *H10K 59/65* (2023.02); *H10K 59/88* (2023.02); *G09G 2300/0426* (2013.01); *G09G 2300/0819* (2013.01); *G09G 2300/0842* (2013.01)

(58) Field of Classification Search
CPC ................. H10K 59/88; G09G 3/3233; G09G 2300/0426; G09G 2300/0842
USPC .......................................................... 257/40
See application file for complete search history.

(56) References Cited

U.S. PATENT DOCUMENTS

| | | |
|---|---|---|
| 11,825,684 B2 | 11/2023 | Park et al. |
| 2020/0235180 A1 | 7/2020 | Park et al. |
| 2020/0287164 A1 | 9/2020 | Choi et al. |
| 2020/0303677 A1 | 9/2020 | Lee et al. |
| 2020/0403050 A1 | 12/2020 | Seon et al. |
| 2022/0199946 A1 | 6/2022 | Lee et al. |
| 2022/0209187 A1 | 6/2022 | Bok et al. |
| 2022/0393138 A1 | 12/2022 | Choi et al. |

FOREIGN PATENT DOCUMENTS

| | | | |
|---|---|---|---|
| KR | 10-2020-0107026 A | 9/2020 | |
| KR | 10-2020-0113092 A | 10/2020 | |
| KR | 10-2020-0145902 A | 12/2020 | |
| KR | 1020210151634 A | 12/2021 | |
| WO | WO-2020054915 A1 * | 3/2020 | ........... F03D 7/0272 |

* cited by examiner

DISPLAY PANEL INCLUDING A METAL DUMMY STACK ARRANGED AT BOTH SIDES OF EACH OF A PLURALITY OF GROOVES

CROSS-REFERENCE TO RELATED APPLICATION

This application is based on and claims priority under 35 U.S.C. § 119 to Korean Patent Application No. 10-2022-0006174, filed on Jan. 14, 2022, in the Korean Intellectual Property Office, the disclosure of which is incorporated by reference herein in its entirety.

BACKGROUND

1. Field

One or more embodiments relate to a display panel, and more particularly, to a display panel including an opening area inside a display area.

2. Description of the Related Art

Recently, the uses of display apparatuses are diversifying. In addition, because the thicknesses of display apparatuses are reduced and the weights of display apparatuses are reduced, the scope of the use is widespread.

While the area of the display area of the display apparatus is enlarged, various functions that combine or associate with the display apparatus are added. As a measure of adding various functions while enlarging the area, researches into display apparatuses in which a variety of components can be arranged in a display area, have been carried out.

SUMMARY

One or more embodiments include a display panel having an opening area in which a variety of types of components may be arranged in a display area, and a display apparatus including the display panel. However, these objectives are examples, and the scope of the present disclosure is not limited thereby.

Additional aspects will be set forth in part in the description which follows and, in part, will be apparent from the description, or may be learned by practice of the presented embodiments of the disclosure.

According to one or more embodiments, a display panel includes a substrate including an opening, a display area surrounding the opening and a middle area arranged between the opening and the display area, a plurality of inorganic insulating layers arranged on the substrate, a first partition wall and a second partition wall arranged in the middle area and arranged in the display area in a direction toward the opening, and a plurality of grooves arranged in the middle area and exposing portions of the plurality of inorganic insulating layers, wherein each of the plurality of grooves may include a metal dummy stack arranged at both sides of each of the grooves based on a virtual vertical line passing through a center of the groove and includes a plurality of metal layers.

The display panel may further include a thin film transistor arranged on the substrate and including a silicon-based semiconductor layer, wherein one of the plurality of metal layers may include the same material as a gate electrode of the thin film transistor.

The display panel may further include a first electrode layer arranged on the plurality of inorganic insulating layers, a first organic insulating layer arranged on the first electrode layer, and a second electrode layer arranged on the first organic insulating layer, wherein a plurality of opening patterns overlapping the plurality of grooves are defined in the second electrode layer.

The plurality of grooves may include two or more grooves arranged between the first partition wall and the second partition wall, and both sides of the first groove that is one of the two or more grooves may be arranged farther from a center of the first groove than both sides of a first opening pattern overlapping the first groove, and both sides of the second groove that is one of the two or more grooves may be arranged closer to a center of the second groove than both sides of a second opening pattern overlapping the second groove.

Based on a virtual vertical line passing through a center of the third groove that is one of the two or more grooves, one side of the third groove may be arranged farther from a center of the third groove than one side of a third opening pattern overlapping the third groove, and other side of the third groove may be arranged closer to a center of the third groove than other side of the third opening pattern.

The plurality of grooves may include a fourth groove overlapping the opening, and a fifth groove arranged between the second partition wall and the fourth groove, a boundary of the fourth groove may be arranged farther from a center of the fourth groove than a boundary of a fourth opening pattern overlapping the fourth groove, one side close to the second partition wall of the fifth groove may be arranged farther from a center of the fifth groove than one side close to the second partition wall of a fifth opening pattern overlapping the fifth groove, and other side close to the opening of the fifth groove may be arranged closer to a center of the fifth groove than the other side close to the opening of the fifth opening pattern.

The first organic insulating layer may be disconnected or separated in a metal contact region in which the metal dummy stack and the second electrode layer are in contact with each other.

A second opening between the opening and the second partition wall may be formed in the plurality of inorganic insulating layers, and one metal layer including a metal dummy stack adjacent to the opening may extend to cover the second opening.

The display panel may further include an encapsulation layer arranged on the first partition wall and the second partition wall and including at least one inorganic encapsulation layer and organic encapsulation layer, and the organic encapsulation layer may be configured to cover grooves arranged between the first partition wall and the second partition wall among the plurality of grooves.

At least portions of the grooves arranged between the first partition wall and the second partition wall may include a tip protruding toward a center of each groove, and the organic encapsulation layer may be configured to bury the tip.

The at least one inorganic encapsulation layer may include a first inorganic encapsulation layer arranged under the organic encapsulation layer, and a second inorganic encapsulation layer arranged on the organic encapsulation layer, and a first portion of the first inorganic encapsulation layer and a first portion of the second inorganic encapsulation layer may be in direct contact with each other on the first partition wall, and a second portion of the first inorganic encapsulation layer and a second portion of the second inorganic encapsulation layer may be in direct contact with each other on the second partition wall.

The first partition wall may include a first protrusion and a second protrusion having a greater height than that of the first protrusion.

According to one or more embodiments, a display panel includes a substrate including a first opening, a display area surrounding the opening, and a middle area between the opening and the display area, a plurality of inorganic insulating layers arranged on the substrate and having a plurality of second openings arranged in the middle area, a first partition wall and a second partition wall arranged in the middle area and arranged in the display area in a direction toward the first opening, a plurality of grooves arranged in the middle area and overlapping the plurality of second openings, and a plurality of lower layers arranged in the middle area and positioned under the plurality of grooves, respectively, wherein each of the plurality of grooves may include a metal dummy stack arranged at both sides of the groove based on a virtual vertical line passing through a center of the groove and including a plurality of metal layers, and an upper surface of each of the plurality of lower layers may correspond to a bottom surface of each of the plurality of grooves.

The display panel may further include a thin film transistor arranged on the substrate and including a silicon-based semiconductor layer, wherein the lower layer may include the same material as the silicon-based semiconductor layer.

One of the plurality of metal layers may include the same material as a gate electrode of the thin film transistor.

The display panel may further include a first barrier layer arranged on the substrate, a second barrier layer arranged on the first barrier layer, and a lower metal pattern arranged between the first barrier layer and the second barrier layer, wherein the lower metal pattern may overlap a boundary of the plurality of openings.

The display panel may further include a first electrode layer arranged on the plurality of inorganic insulating layers, a first organic insulating layer arranged on the first electrode layer, and a second electrode layer arranged on the first organic insulating layer and having a plurality of opening patterns overlapping the plurality of grooves, and the first organic insulating layer may be configured to cover an inner surface of the plurality of second openings.

The plurality of grooves may include two or more grooves arranged between the first partition wall and the second partition wall, and both sides of the first groove that is one of the two or more grooves may be arranged farther from a center of the first groove than both sides of a first opening pattern overlapping the first groove, and both sides of a second groove that is one of the two or more grooves may be arranged closer to a center of the second groove than both sides of a second opening pattern overlapping the second groove.

Based on a virtual vertical line passing through a center of a third groove that is one of the two or more grooves, one side of the third groove may be arranged farther from a center of the third groove than one side of the third opening pattern overlapping the third groove, and the other side of the third groove may be arranged closer to a center of the third groove than the other side of the third opening pattern.

The plurality of grooves may include a fourth groove overlapping the first opening and a fifth groove arranged between the second partition wall and the fourth groove, and a boundary of the fourth groove may be arranged farther from a center of the fourth groove than a boundary of a fourth opening pattern of the plurality of opening patterns overlapping the fourth groove, and one side close to the second partition wall of the fifth groove may be arranged farther from a center of the fifth groove than one side close to the second partition wall of a fifth opening pattern of the plurality of opening patterns overlapping the fifth groove, and other side close to the opening of the fifth groove may be arranged closer to a center of the fifth groove than other side close to the opening of the fifth opening pattern.

The display panel may further include an encapsulation layer arranged on the first partition wall and the second partition wall and including at least one inorganic encapsulation layer and an organic encapsulation layer, wherein the organic encapsulation layer may be configured to cover grooves arranged between the first partition wall and the second partition wall among the plurality of grooves.

At least portions of the grooves arranged between the first partition wall and the second partition wall may include a tip protruding toward a center of each groove, and the organic encapsulation layer may be configured to bury the tip.

Other aspects, features, and advantages than those described above may be apparent from the following drawings, the claims, and the detailed description of the disclosure.

BRIEF DESCRIPTION OF THE DRAWINGS

The above and other aspects, features, and advantages of certain embodiments of the disclosure will be more apparent from the following description taken in conjunction with the accompanying drawings, in which.

DETAILED DESCRIPTION

Figure 1:
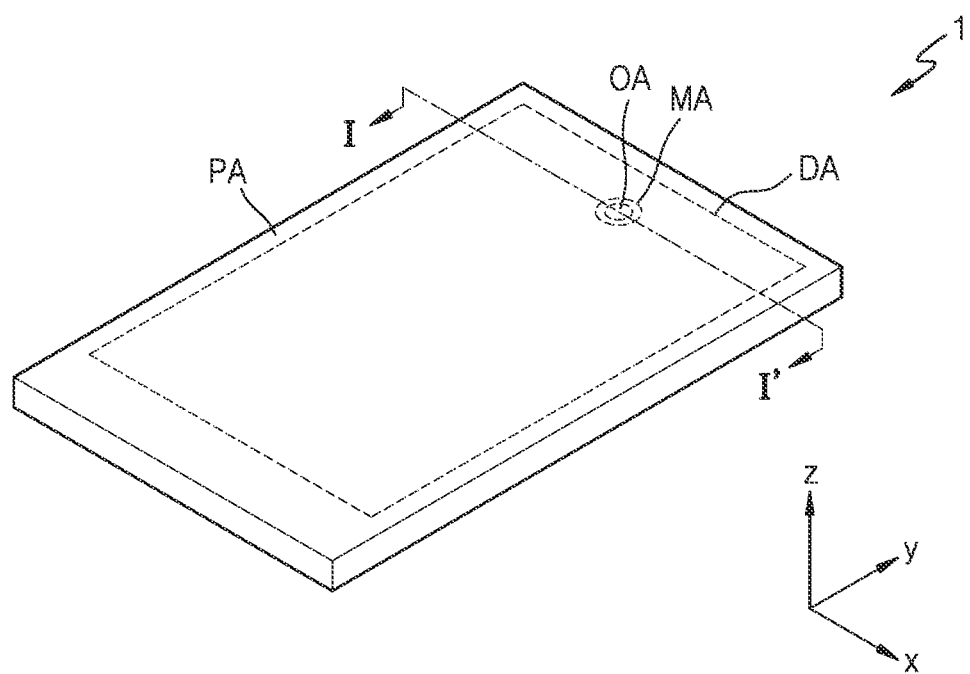
FIG. 1 is a perspective view schematically illustrating an electronic device according to an embodiment.

Reference will now be made in detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects of the present description. As used herein, the term "and/or" includes any and all combinations of one or more of the associated listed items. Throughout the disclosure, the expression "at least one of a, b or c" indicates only a, only b, only c, both a and b, both a and c, both b and c, all of a, b, and c, or variations thereof.

Since various modifications and various embodiments of the present disclosure are possible, specific embodiments are illustrated in the drawings and described in detail in the detailed description. Effects and features of the present disclosure, and a method of achieving them will be apparent with reference to embodiments described below in detail in conjunction with the drawings. However, the present disclosure is not limited to the embodiments disclosed herein, but may be implemented in a variety of forms.

Hereinafter, embodiments of the present disclosure will be described in detail with reference to the accompanying drawings, and the same or corresponding components are denoted by the same reference numerals, and the same reference numerals are assigned and redundant explanations will be omitted.

In the present specification, the terms of the first and second, etc. were used for the purpose of distinguishing one component from other components, not a limited sense.

In the present specification, the singular expression includes a plurality of expressions unless the context is clearly different.

In the present specification, the terms such as comprising or having are meant to be the features described in the specification, or the components are present, and the possibility of one or more other features or components will be added, is not excluded in advance.

In the present specification, when a portion such as a layer, a region, a component or the like is on other portions, this is not only when the portion is on other components, but also when other components are interposed therebetween.

In the present specification, when a layer, a region, a component or the like is connected to other components, this is not only when a layer, a region, a component or the like is directly connected to each other or/and but also when a layer, a region, a component or the like is indirectly connected to each other while another layer, another region, another component or the like is interposed therebetween. For example, in the present specification, when a layer, a region, a component or the like is electrically connected to each other, this is not only when a layer, a region, a component or the like is directly electrically connected to each other and/or but also when a layer, a region and a component or the like is indirectly electrically connected to each other while another layer, another region, another component or the like is interposed therebetween.

In the present specification, "A and/or B" indicates A, B, or A and B. In addition, "at least one of A and B" indicates A, B, or A and B.

In the present specification, the x-axis, y-axis, and z-axis are not limited to three axes on an orthogonal coordinate system, and may be interpreted in a broad sense including this case. For example, the x-axis, the y-axis, and the z-axis may be orthogonal to each other, but may refer to different directions that do not orthogonal to each other.

In the case where some embodiments may be implemented in the present specification, a specific process order may be performed differently from the order described. For example, two processes described in succession may be substantially performed at the same time, or in an opposite order to an order to be described.

In the drawings, for convenience of explanation, the sizes of components may be exaggerated or reduced. For example, since the size and thickness of each component shown in the drawings are arbitrarily indicated for convenience of explanation, the present disclosure is not necessarily limited to the illustration.

FIG. 1 is a perspective view schematically illustrating an electronic device according to an embodiment.

Referring to FIG. 1, an electronic device 1 that is a device for displaying a video or still image may be used as a display screen for various products, such as portable electronic devices, for example, mobile phones, smartphones, tablet personal computers (PCs), mobile communication terminals, electronic notebooks, e-books, and Portable Multimedia Players (PMPs), navigation devices, Ultra Mobile PCs (UMPCs), televisions, laptop computers, monitors, billboards, and Internet of Things (IoT), and the like. Also, the electronic device 1 according to an embodiment may be used in a wearable device such as a smart watch, a watch phone, a glasses-type display, and a head mounted display (HMD). In addition, the electronic device 1 according to an embodiment may be used as a vehicle instrument panel, a center information display (CID) disposed on a center fascia or a dashboard of a vehicle, a room mirror display that replaces a side mirror of the vehicle, or a display that is disposed on a rear surface of a front seat as an entertainment for a back seat of the vehicle. FIG. 1 illustrates that the electronic device 1 according to an embodiment is used as a smartphone, for convenience of explanation.

The electronic device 1 may have a rectangular shape in a planar view. For example, the electronic device 1 may have a planar rectangular shape with short sides in an x-direction and long sides in a y-direction, as shown in FIG. 1. Edges in which short sides in the x-direction and long sides in the y-direction meet each other, may be formed to be rounded or right angles to have a certain curvature. The planar shape of the electronic device 1 is not limited to the rectangular shape, but the electronic device 1 may be formed in another polygonal shape, an elliptical form, or an amorphous form.

The electronic device 1 may include an opening area OA (or a first area) and a display area DA (or a second area) at least surrounding the opening area OA. The electronic device 1 may include a middle area MA (or a third area) between the opening area OA and the display area DA, and an outside of the display area DA, for example, a peripheral area PA (or a fourth area) surrounding the display area DA. The middle area MA may have a closed loop shape entirely surrounding the opening area OA in a planar view.

The opening area OA may be located inside the display area DA. According to an embodiment, the opening area OA may be in the upper middle of the display area DA, as shown in FIG. 1. Alternatively, the opening area OA may be arranged in various forms as being arranged at a left upper side of the display area DA or at a right upper side of the display area DA. In FIG. 1, one opening area OA is arranged. However, in another embodiment, a plurality of opening areas OA may be provided.

Figure 2:
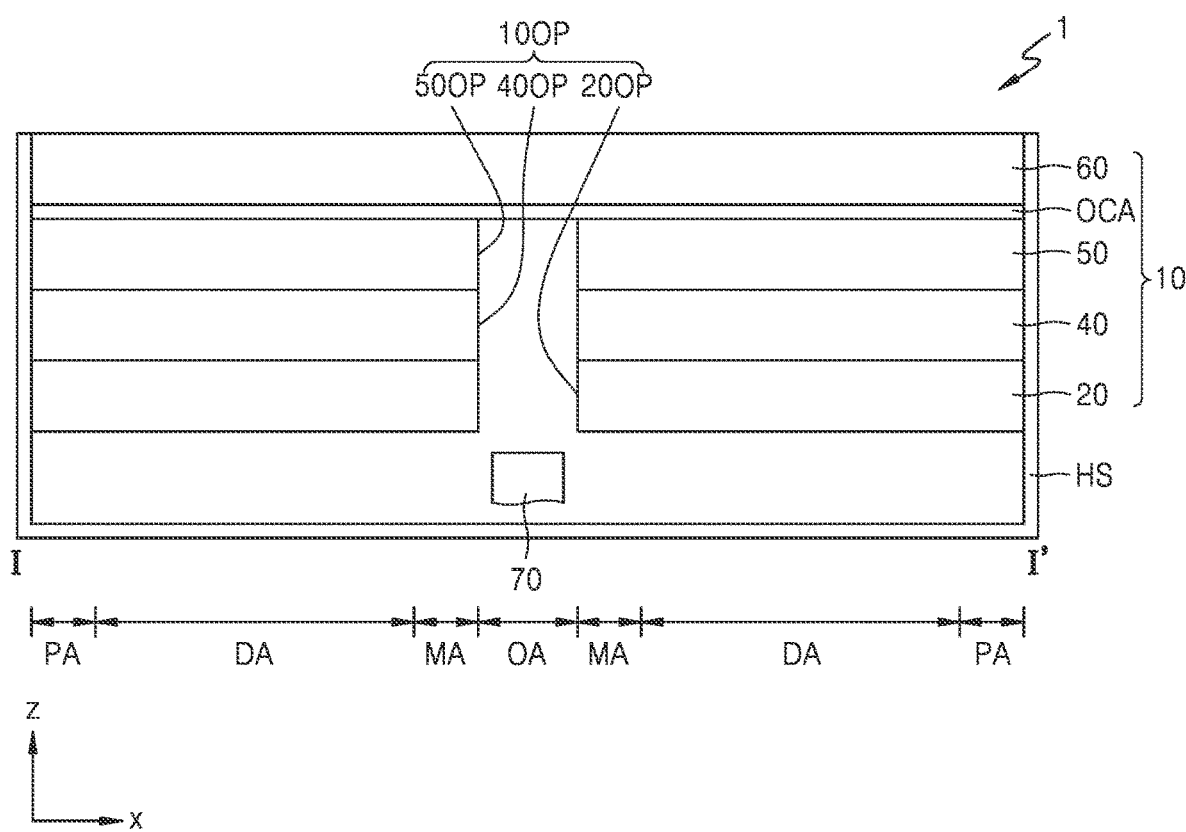
FIG. 2 is a cross-sectional view schematically illustrating a display panel according to an embodiment, taken along line I-I' of FIG. 1.

FIG. 2 is a cross-sectional view schematically illustrating a display panel according to an embodiment, taken along line I-I' of FIG. 1.

Referring to FIG. 2, the electronic device 1 may include a display panel 10 and a component 70 arranged in the opening area OA of the display panel 10. The display panel 10 and the component 70 may be accommodated in a housing HS.

The display panel 10 may include an image generating layer 20, an input sensing layer 40, an optical functional layer 50, and a cover window 60.

The image generating layer 20 may include display elements (or light-emitting elements) that emit light so as to display an image. Each of the display elements may include a light-emitting diode, for example, an organic light-emitting diode including an organic light-emitting layer. In another embodiment, the light-emitting diode may be an inorganic light-emitting diode including an inorganic material. The inorganic light-emitting diode may include a PN junction diode including inorganic material semiconductor-based materials. When a voltage is applied to a PN junction diode in a forward direction, holes and electrons may be injected into the PN junction diode, and energy generated by recombination of the holes and the electrons may be converted into light energy so that light of a certain color may be emitted. The above-described inorganic light-emitting diode may have a width of several to several hundreds of micrometers or several to several hundreds of nanometers.

In some embodiments, the image generating layer 20 may include a quantum dot light-emitting diode. For example, the light-emitting layer of the image generating layer 20 may include an organic material, an inorganic material, quantum dots, an organic material and quantum dots, or an inorganic material and quantum dots.

The input sensing layer 40 may acquire coordinate information according to an external input, for example, a touch event. The input sensing layer 40 may include a sensing electrode or a touch electrode and trace lines connected to the sensing electrode. The input sensing layer 40 may be arranged on the image generating layer 20. The input sensing layer 40 may sense an external input in a mutal cap manner or/and a self cap manner.

The input sensing layer 40 may be formed directly on the image generating layer 20 or may be separately formed and then may be coupled to the image generating layer 20 via an adhesive layer such as an optical clear adhesive (OCA). For example, the input sensing layer 40 may be continuously formed after a process of forming the image generating layer 20 is performed. In this case, the adhesive layer may not be arranged between the input sensing layer 40 and the image generating layer 20. In FIG. 2, the input sensing layer 40 is disposed between the image generating layer 20 and the optical functional layer 50. However, in another embodiment, the input sensing layer 40 may be arranged on the optical functional layer 50.

The optical functional layer 50 may include an antireflection layer. The antireflection layer may be configured to reduce reflectivity of light (external light) incident onto the display panel 10 from the outside through the cover window 60. The antireflection layer may include a retarder and a polarizer. In another embodiment, the antireflection layer may include a black matrix and color filters. The color filters may be arranged considering color of light emitted from each of light-emitting diodes of the image generating layer 20.

In order to enhance transmissivity of the opening area OA, an opening 10OP through which portions of layers forming the display panel 10 pass may be defined in the display panel 10. The opening 10OP may include first through third openings 20OP, 40OP, and 50OP through which each of the image generating layer 20, the input sensing layer 40 and the optical functional layer 50 pass, respectively. The first opening 20OP of the image generating layer 20, the second opening 40OP of the input sensing layer 40, and the third opening 50OP of the optical functional layer 50 may overlap one another so that the opening 10OP of the display panel 10 may be formed.

The cover window 60 may be arranged on the optical functional layer 50. The cover window 60 may be coupled to the optical functional layer 50 using an adhesive layer such as an OCA between the cover window 60 and the optical functional layer 50. The cover window 60 may cover the first opening 20OP of the image generating layer 20, the second opening 40OP of the input sensing layer 40, and the third opening 50OP of the optical functional layer 50.

The cover window 60 may include a glass material or a plastic material. The glass material may include ultra-thin glass. The plastic material may include polyethersulfone, polyacrylate, polyetherimide, polyethyelenene napthalate, polyethyelene terephthalate, polyphenylene sulfide, polyarylate, polyimide, polycarbonate, or cellulose acetate propionate.

The opening area OA may be a kind of component area (e.g., a sensor area, a camera area, a speaker area, or the like) in which the component 70 for adding various functions to the electronic device 1 is positioned.

The component 70 may include an electronic element. For example, the component 70 may be an electronic element using light or sound. More particularly, the electronic element may include a sensor using light, such as an infrared ray sensor, a camera for capturing an image by receiving light, a sensor for measuring a distance or recognizing a finger print or the like by outputting and detecting light or sound, a small lamp for outputting light, or a speaker for outputting sound. The electronic element using light may use light in various wavelength bands, such as visible rays, infrared rays, ultraviolet rays, and the like. The opening area OA may correspond to an area through which light or/and sound outputted from the component to the outside or proceeding toward the electronic element from the outside may transmit.

Figure 3:
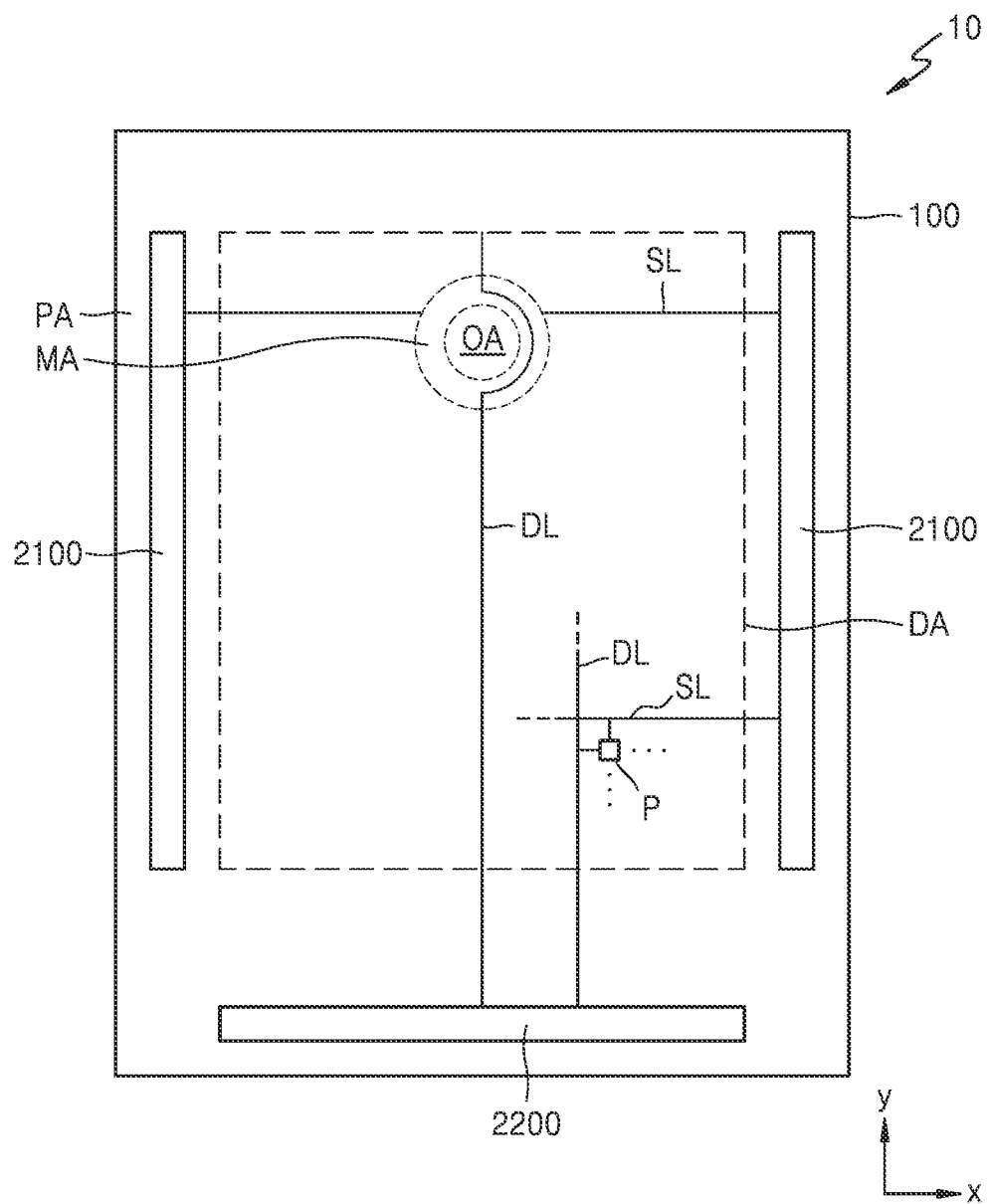
FIG. 3 is a plan view schematically illustrating a display panel according to an embodiment.

FIG. 3 is a plan view schematically illustrating a display panel according to an embodiment.

Referring to FIG. 3, a display panel 10 may include an opening area OA, a display area DA, a middle area MA, and a peripheral area PA. For example, the substrate 100 of the display panel 10 may be defined to include the opening area OA, the display area DA, the middle area MA, and the peripheral area PA.

The display panel 10 may include a plurality of sub-pixels P arranged in the display area DA, and the display panel 10 may display an image using light emitted from each of the sub-pixels P. Each sub-pixel P may emit light of a red color, a green color or a blue color using the light-emitting diode. The light-emitting diode of each sub-pixel P may be electrically connected to a scan line SL and a data line DL.

A scan driver 2100 for providing a scan signal to each sub-pixel P, a data driver 2200 for providing a data signal to each sub-pixel P, and a first main power supply wiring (not shown) and a second main power supply wiring (not shown) for providing a driving voltage and a common voltage may be arranged in the peripheral area PA. The scan driver 2100 may be arranged at each of both sides of the peripheral area PA with the display area DA therebetween. In this case, the sub-pixel P arranged on the left of the opening area OA may be connected to the scan driver 2100 arranged on the left of the peripheral area PA, and the sub-pixel P arranged on the right of the opening area OA may be connected to the scan driver 2100 arranged on the right of the peripheral area PA.

The middle area MA may surround the opening area OA. That is, the middle area MA may be disposed around the opening area OA. Signal lines for providing signals to the sub-pixels P provided in the vicinity of the opening area OA may pass through the middle area MA that is an area in which a display element such as a light-emitting diode for emitting light is not arranged. For example, the data lines DL and/or the scan lines SL may cross the display area DA, and portions of the data lines DL and/or the scan lines SL may bypass in the middle area MA along an edge of the opening 10OP (refer to FIG. 2) of the display panel 10 formed in the opening area OA. In an embodiment, FIG. 3 illustrates that the data lines DL cross the display area DA in a y-direction and some data lines DL bypass in the middle area MA to partially surround the opening area OA. The scan lines SL may cross the display area DA in an x-direction and may be spaced apart from each other with respect to the opening area OA therebetween.

In FIG. 3, the data driver 2200 is arranged adjacent to one side of the substrate 100. That is, the data driver 2200 may be disposed in the peripheral area PA. However, according to another embodiment, the data driver 2200 may be arranged on a printed circuit board electrically connected to a pad arranged at one side of the display panel 10. The printed circuit board may be flexible, and a portion of the printed circuit board may be bent to be located under a rear surface of the substrate 100.

Figure 4:
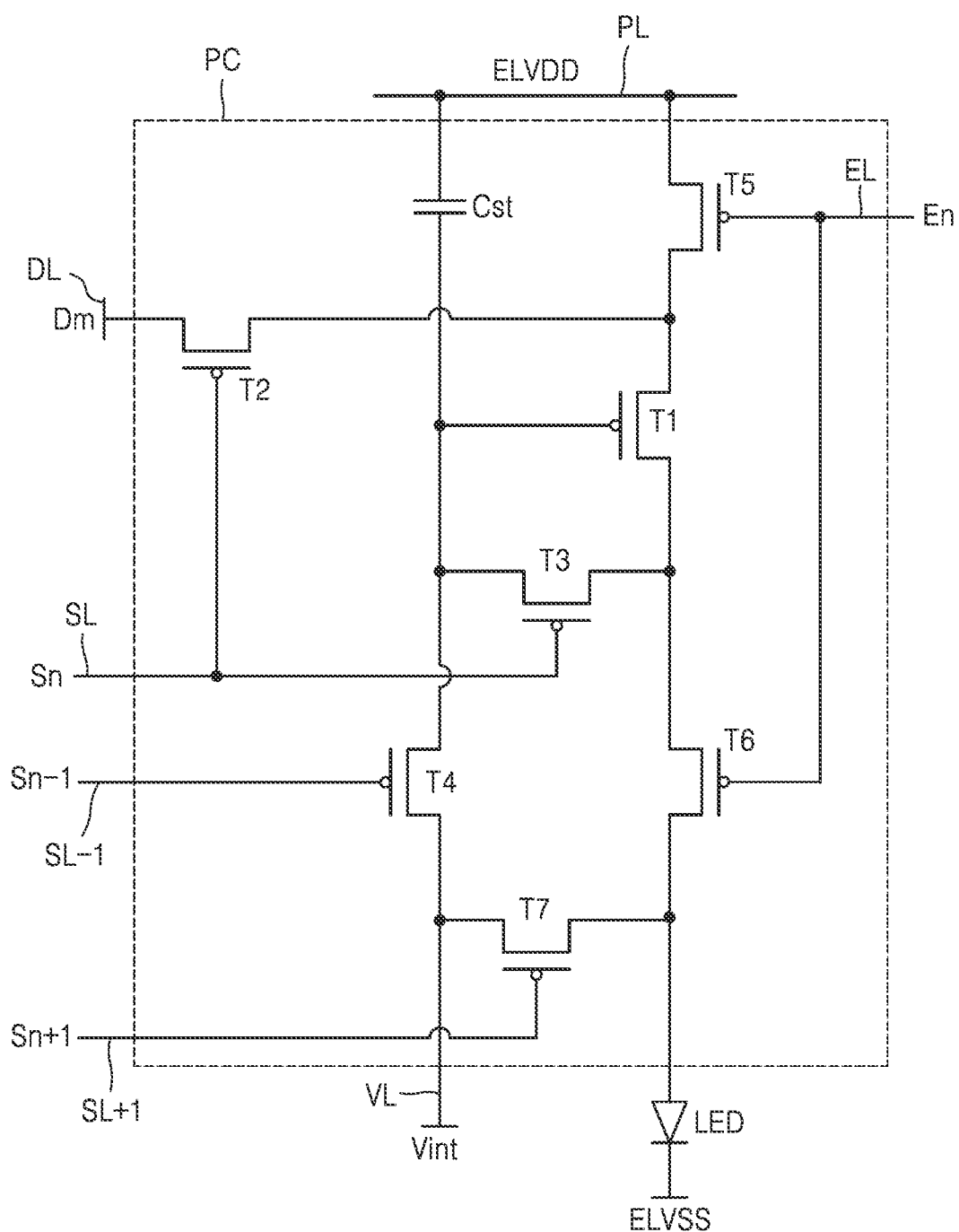
FIG. 4 is an equivalent circuit diagram schematically illustrating a light-emitting diode and a circuit connected to the light-emitting diode according to an embodiment.

FIG. 4 is an equivalent circuit diagram schematically illustrating a light-emitting diode and a circuit connected to the light-emitting diode according to an embodiment.

Referring to FIG. 4, the sub-pixels P described with reference to FIG. 3 may emit light through a light-emitting diode LED, and the light-emitting diode LED may be electrically connected to a sub-pixel circuit PC.

The sub-pixel circuit PC may include a first thin film transistor T1, a second thin film transistor T2, a third thin film transistor T3, a fourth thin film transistor T4, a fifth thin film transistor T5, a sixth thin film transistor T6, a seventh thin film transistor T7, and a storage capacitor Cst.

The second thin film transistor T2 that is a switching thin film transistor may be connected to the scan line SL and the data line DL and may transmit a data voltage (or a data signal) Dm inputted from the data line DL based on a switching voltage (or a switching signal) Sn inputted from the scan line SL, to the first thin film transistor T1. The storage capacitor Cst may be connected to the second thin film transistor T2 and the driving voltage line PL and may store a voltage corresponding to a difference between a voltage transmitted from the second thin film transistor T2 and a driving voltage ELVDD supplied to the driving voltage line PL.

The first thin film transistor T1 that is a driving thin film transistor may be connected to the driving voltage line PL and the storage capacitor Cst and may control a driving current flowing through the light-emitting diode LED from the driving voltage line PL in response to a value of a voltage stored in the storage capacitor Cst. The light-emitting diode LED may emit light having certain brightness by using the driving current. A second electrode (e.g., a cathode) of the light-emitting diode LED may receive a common voltage ELVSS.

The third thin film transistor T3 may be a compensation thin film transistor, and a gate electrode of the third thin film transistor T3 may be connected to the scan line SL. A source electrode (or a drain electrode) of the third thin film transistor T3 may be connected to a drain electrode (or a source electrode) of the first thin film transistor T1 and may be connected to a first electrode of the light-emitting diode LED via the sixth thin film transistor T6. A drain electrode (or a source electrode) of the third thin film transistor T3 may be connected to one electrode of the storage capacitor Cst, a source electrode (or a drain electrode) of the fourth thin film transistor T4, and a gate electrode of the first thin film transistor T1. The third thin film transistor T3 may be turned on according to the scan signal Sn transmitted through the scan line SL and may connect the gate electrode and the drain electrode of the first thin film transistor T1 to each other, thereby diode-connecting the first thin film transistor T1.

The fourth thin film transistor T4 may be an initialization thin film transistor, and a gate electrode of the fourth thin film transistor T4 may be connected to a previous scan line SL-1. A drain electrode (or a source electrode) of the fourth thin film transistor T4 may be connected to an initialization voltage line VL. The source electrode (or drain electrode) of the fourth thin film transistor T4 may be connected to one electrode of the storage capacitor Cst, a drain electrode (or a source electrode) of the third thin film transistor T3, and the gate electrode of the first thin film transistor T1. The fourth thin film transistor T4 may be turned on in response to the previous scan signal Sn-1 transmitted through the previous scan line SL-1 and may transmit an initialization voltage Vint to the gate electrode of the first thin film transistor T1 to perform an initialization operation of initializing a voltage of the gate electrode of the first thin film transistor T1.

The fifth thin film transistor T5 may be an operation control thin film transistor, and a gate electrode of the fifth thin film transistor T5 may be connected to an emission control line EL. A source electrode (or a drain electrode) of the fifth thin film transistor T5 may be connected to the driving voltage line PL. A drain electrode (or a source electrode) of the fifth thin film transistor T5 may be connected to a source electrode (or a drain electrode) of the first thin film transistor T1 and a drain electrode (or a source electrode) of the second thin film transistor T2.

The sixth thin film transistor T6 may be an emission control thin film transistor, and a gate electrode of the sixth thin film transistor T6 may be connected to the emission control line EL. A source electrode (or a drain electrode) of the sixth thin film transistor T6 may be connected to a drain electrode (or a source electrode) of the first thin film transistor T1 and a source electrode (or a drain electrode) of the third thin film transistor T3. A drain electrode (or a source electrode) of the sixth thin film transistor T6 may be electrically connected to a first electrode of the light-emitting diode LED. The fifth thin film transistor T5 and the sixth thin film transistor T6 may be simultaneously turned on in response to the emission control signal En transmitted through the emission control line EL, so that the driving voltage ELVDD may be transmitted to the light-emitting diode LED and a driving current may flow through the light-emitting diode LED.

The seventh thin film transistor T7 may be an initialization thin film transistor for initializing a first electrode of the light-emitting diode LED. A gate electrode of the seventh thin film transistor T7 may be connected to a next scan line SL+1. A source electrode (or a drain electrode) of the seventh thin film transistor T7 may be connected to the first electrode of the light-emitting diode LED. A drain electrode (or a source electrode) of the seventh thin film transistor T7 may be connected to the initialization voltage line VL. The seventh thin film transistor T7 may be turned on in response to the next scan signal Sn+1 transmitted through the next scan line SL+1 and may initialize the first electrode of the light-emitting diode LED.

In FIG. 4, the fourth thin film transistor T4 and the seventh thin film transistor T7 are connected to the previous scan line SL-1 and the next scan line SL+1, respectively. However, in another embodiment, all of the fourth thin film transistor T4 and the seventh thin film transistor T7 may be connected to the previous scan line SL-1 and may be driven in response to the previous scan signal Sn-1.

Another electrode of the storage capacitor Cst may be connected to the driving voltage line PL. One electrode of the storage capacitor Cst may be together connected to the gate electrode of the first thin film transistor T1, the drain electrode (or source electrode) of the third thin film transistor T3, and the source electrode (or drain electrode) of the fourth thin film transistor T4.

A second electrode (e.g., a cathode) of the light-emitting diode LED may receive a common voltage ELVSS. The light-emitting diode LED may receive a driving current from the first thin film transistor T1 and may emit light.

Figure 5:
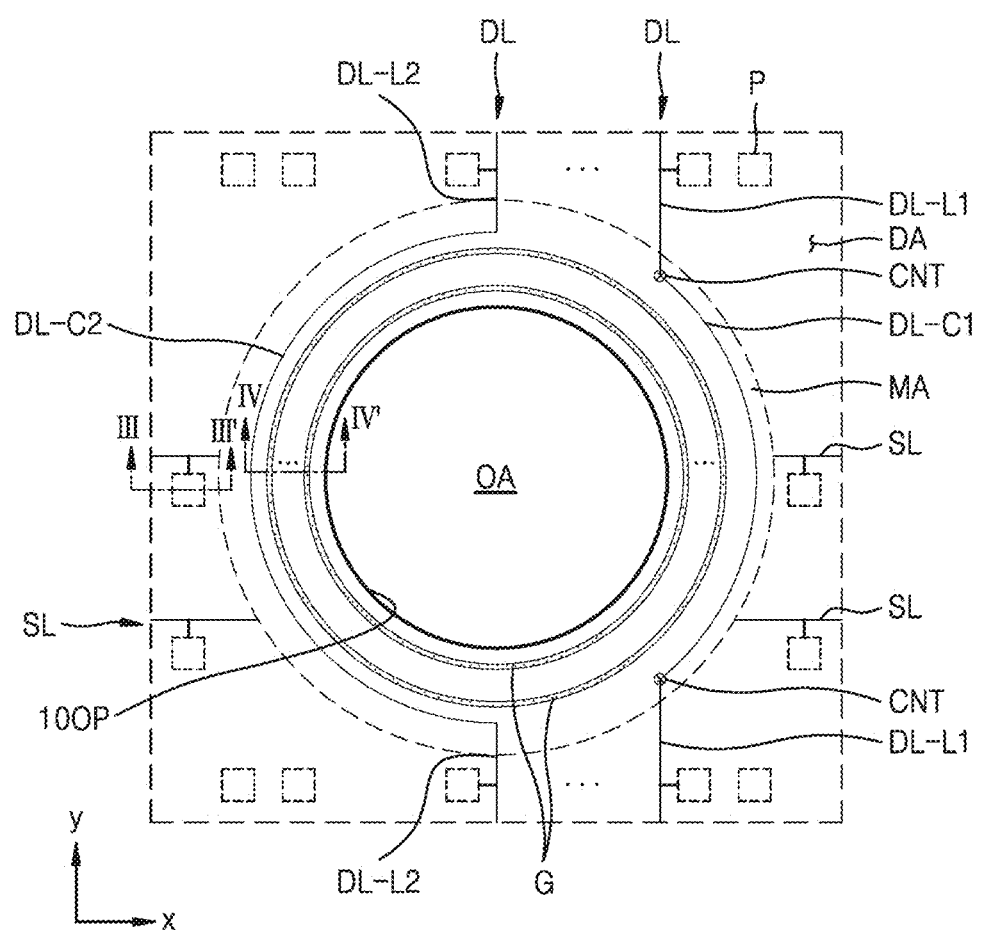
FIG. 5 is a plan view of a portion of a display panel according to an embodiment.

FIG. 5 is a plan view of a portion of a display panel according to an embodiment.

Referring to FIG. 5, sub-pixels P may be arranged in the display area DA. A middle area MA may be disposed between the opening area OA and the display area DA. The sub-pixels P adjacent to the opening area OA may be spaced apart from each other based on the opening area OA in a planar view. In the planar view of FIG. 5, the sub-pixels P may be spaced apart from each other based on the opening area OA in a vertical direction or in a horizontal direction. Because, as described above with reference to FIGS. 3 and 4, each of the sub-pixels P may use light of a red color, a green color and a blue light emitted from the light-emitting diode LED, the positions of the sub-pixels P shown in FIG. 5 correspond to positions of light-emitting diodes LED, respectively. Therefore, the sub-pixels P spaced apart from each other based on the opening area OA in a planar view may indicate that light-emitting diode LED are spaced apart from each other based on the opening area OA in a planar view. For example, in a planar view, the light-emitting diode LED may be spaced apart from each other based on the opening area OA in a vertical direction or in a horizontal direction.

Signal lines adjacent to the opening area OA among signal lines for supplying a signal to a pixel circuit connected to the light-emitting diode LED of each sub-pixel P may bypass the opening area OA and/or the opening 10OP. Some data lines DL of data lines passing through the display area DA may extend along the y-direction to provide data signals to the sub-pixels P arranged in the vertical and horizontal directions with respect to the opening area OA and may bypass along the edge of the opening area OA and/or the opening 10OP in the middle area MA.

A bypass portion DL-C1 of at least one data line DL among the data lines DL may be formed on different layers from an extension portion DL-L1 crossing the display area DA, and a bypass portion DL-C1 and the extension portion DL-L1 of the data line DL may be connected to each other via a contact hole CNT. A bypass portion DL-C2 of at least one data line DL among the data lines DL may be positioned on the same layer as the extension portion DL-L2 and may be integrally formed.

The scan lines SL may be separated or disconnected from each other based on the opening area OA, and the scan line SL disposed on the left of the opening area OA may receive a signal from a scan driver 2100 arranged on the left of the display area DA, as described above with reference to FIG. 3, and the scan line SL disposed on the right of the opening area OA may receive a signal from the scan driver 2100 arranged on the right of the display area DA shown in FIG. 3.

Grooves G may be located between an area which data lines DL bypass, of the middle area MA and the opening area OA. Each of the grooves G may be disposed more closely to the opening area OA than the data lines DL. In a planar view, each of the grooves G may have a closed loop shape surrounding the opening area OA, and the grooves G may be spaced apart from each other.

Figure 6:
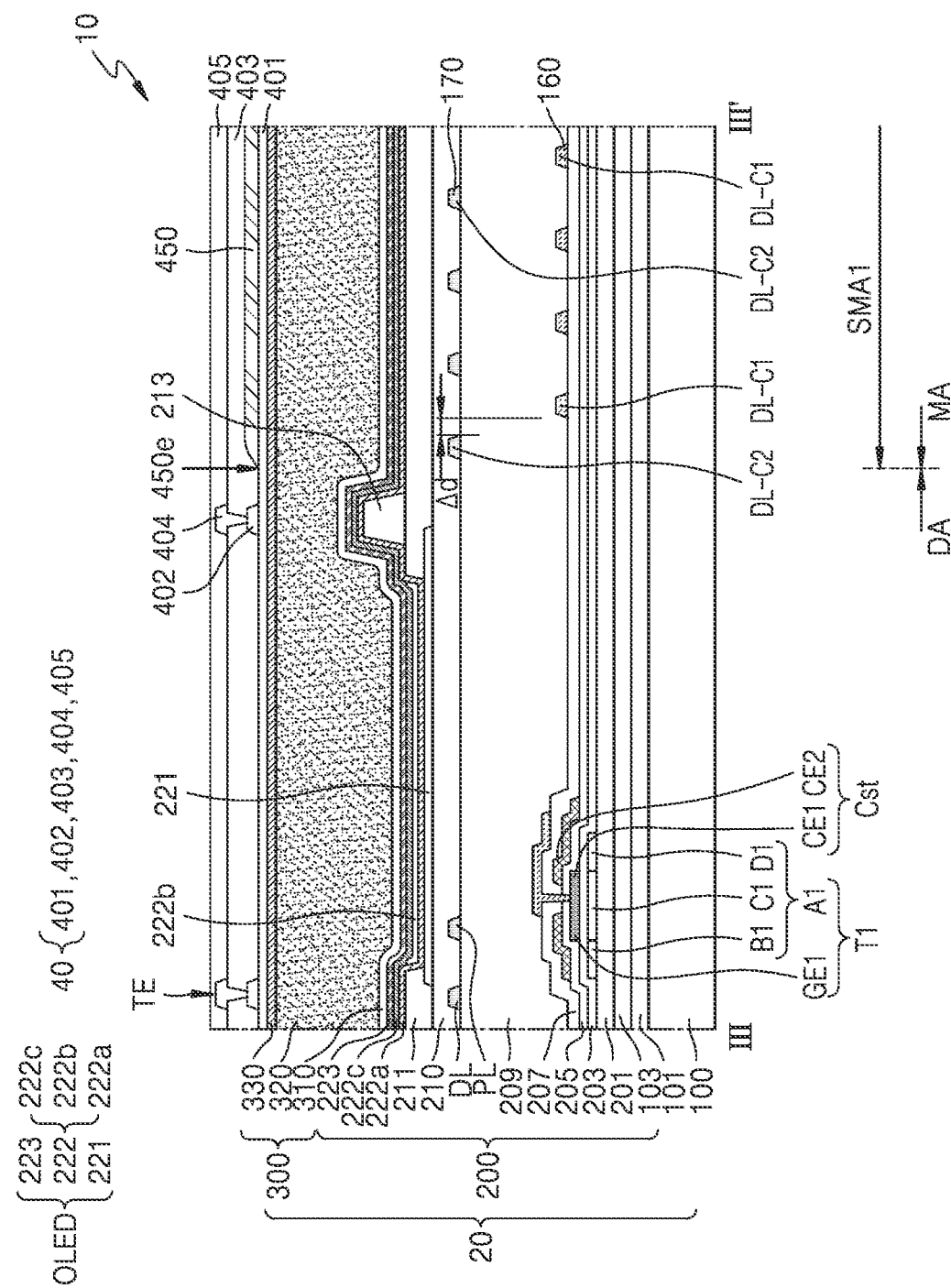
FIG. 6 is a cross-sectional view of a display panel according to an embodiment, taken along line III-III' of FIG. 5.

FIG. 6 is a cross-sectional view of a display panel according to an embodiment, taken along a line III-III' of FIG. 5.

Referring to the display area DA of FIG. 6, the substrate 100 may include a glass material or polymer resin. In an embodiment, the substrate 100 may have a structure in which a base layer including a polymer resin and a barrier layer including an inorganic insulating material such as silicon oxide or silicon nitride are alternately stacked to each other. The polymer resin may include a polymer resin such as polyethersulfone, polyacrylate, polyetherimide, polyethyelenene napthalate, polyethyelene terephthalate, polyphenylene sulfide, polyarylate, polyimide, polycarbonate, or cellulose acetate propionate.

A sub-pixel circuit PC (refer to FIG. 4) including a plurality of inorganic insulating layers IL (refer to FIG. 7) may be formed on the substrate 100, and a display element, for example, an organic light-emitting diode OLED may be arranged on the sub-pixel circuit PC.

Before the sub-pixel circuit PC is formed, a first barrier layer 101, a second barrier layer 103, and a buffer layer 201 may be formed on the substrate 100 to prevent impurities from penetrating into the sub-pixel circuit PC. Each of the first barrier layer 101, the second barrier layer 103, and the buffer layer 201 may include an inorganic insulating material such as silicon nitride, silicon oxynitride, or silicon oxide, and may have a single layer or multi-layered structure including the above-described inorganic insulating materials.

Although not shown in FIG. 6, a lower metal layer (not shown) may be arranged between the first barrier layer 101 and the second barrier layer 103. The lower metal layer may be arranged between the sub-pixel circuit PC and the substrate 100 and may prevent light emitted from a component 70 (refer to FIG. 2) or external light from reaching a thin film transistor (TFT) of the sub-pixel circuit PC.

The sub-pixel circuit PC may include a plurality of transistors and a storage capacitor, as described above with reference to FIG. 4. In this regard, FIG. 6 illustrates a first thin film transistor T1 and a storage capacitor Cst.

The first thin film transistor T1 may include a semiconductor layer A1 arranged on the buffer layer 201 and a gate electrode (hereinafter, referred to as a first gate electrode GE1) that overlaps a channel region C1 of the semiconductor layer A1. The semiconductor layer A1 may include a silicon-based semiconductor material, for example, polysilicon. The semiconductor layer A1 may include the channel region C1, a first region B1, and a second region D1, which are arranged at both sides of the channel region C1. The first region B1 and the second region D1 may be regions including impurities having higher concentration than the channel region C1, and one of the first region B1 and the second region D1 may correspond to a source region, and the other one thereof may correspond to a drain region.

A gate insulating layer 203 may be arranged between the semiconductor layer A1 and the gate electrode GE1. The gate insulating layer 203 may include an inorganic insulating material such as silicon oxide, silicon nitride, or silicon oxynitride, and may have a single layer or multi-layered structure including the above-described inorganic insulating materials.

The gate electrode GE1 may include a conductive material including molybdenum (Mo), aluminum (Al), copper (Cu), titanium (Ti), and the like, and may have a single layer or multi-layered structure including the above-described materials.

The storage capacitor Cst may include a lower electrode CE1 and an upper electrode CE2 that overlap the lower electrode CE1. In an example, the lower electrode CE1 of the storage capacitor Cst may include a gate electrode GE1. In other words, the gate electrode GE1 may include the lower electrode CE1 of the storage capacitor Cst. For example, the gate electrode GE1 and the lower electrode CE1 of the storage capacitor Cst may be integrally formed.

A first interlayer insulating layer 205 may be arranged between the lower electrode CE1 and the upper electrode CE2 of the storage capacitor Cst. The first interlayer insulating layer 205 may include an inorganic insulating material such as silicon oxide, silicon nitride, or silicon oxynitride, and may have a single layer or multi-layered structure including the above-described inorganic insulating materials.

The upper electrode CE2 of the storage capacitor Cst may include a low-resistance conductive material such as Mo, Al, Cu and/or Ti, and may have a single layer or multi-layered structure including the above-described materials.

A second interlayer insulating layer 207 may be arranged on the storage capacitor Cst. The second interlayer insulating layer 207 may include an inorganic insulating material such as silicon oxide, silicon nitride, or silicon oxynitride, and may have a single layer or multi-layered structure including the above-described inorganic insulating materials.

The second through seventh transistors (see T2, T3, T4, T5, T6, and T7 of FIG. 4) described with reference to FIG. 4 may have the same as or similar structure to that of the first thin film transistor T1 described in FIG. 6. For example, the second through seventh thin film transistors T2, T3, T4, T5, T6, and T7 may include a semiconductor layer arranged on the same layer as the semiconductor layer A1 of the first thin film transistor T1 and a gate electrode arranged on the same layer as the gate electrode GE1 of the first thin film transistor T1. In an embodiment, portions of semiconductor layers of the second through seventh thin film transistors (see T2, T3, T4, T5, T6, and T7 of FIG. 4) may be integrally connected to the semiconductor layer A1 of the first thin film transistor T1.

A first electrode layer 160 may be arranged on the second interlayer insulating layer 207. Connection nodes for electrically connecting elements of the sub-pixel circuit PC to the organic light-emitting diode OLED may be arranged on the first electrode layer 160. The first electrode layer 160 may include Al, Cu, and/or Ti, and may have a single layer or multi-layer structure including the above-described materials. For example, the first electrode layer 160 may have a three-layer structure of a Ti layer/an Al layer/a Ti layer.

A first organic insulating layer 209 may be arranged on the first electrode layer 160. The first organic insulating layer 209 may include an organic insulating material. The organic insulating material may include acryl, benzocyclobutene (BCB), polyimide, or hexamethyldisiloxane (HMDSO).

The second electrode layer 170 including the data line DL and the driving voltage line PL may be arranged on the first organic insulating layer 209 and may be covered by the second organic insulating layer 210. The second electrode layer 170 may include Al, Cu, and/or Ti, and may have a single layer or multi-layer structure including the above-described materials. For example, the second electrode layer 170 may have a three-layer structure of a Ti layer/an Al layer/a Ti layer. The second organic insulating layer 210 may include an organic insulating material such as acryl, BCB, polyimide and/or HMDSO.

FIG. 6 illustrates that the data line DL and the driving voltage line PL are included in the second electrode layer 170 formed on the first organic insulating layer 209. However, embodiments are not limited thereto. In another embodiment, one of the data line DL and the driving voltage line PL may be included in the first electrode layer 160 and may be arranged on the second interlayer insulating layer 207.

A display element, for example, the organic light-emitting diode OLED may be arranged on the second organic insulating layer 210. The organic light-emitting diode OLED may includes a first electrode 221, an intermediate layer 222, and a second electrode 223.

The first electrode 221 of the organic light-emitting diode OLED disposed on the second organic insulating layer 210 may include a reflective layer including silver (Ag), magnesium (Mg), Al, platinum (Pt), palladium (Pd), gold (Au), nickel (Ni), neodymium (Nd), iridium (Ir), chromium (Cr), or a compound thereof. In another embodiment, the first electrode 221 may further include a conductive oxide layer on and/or under the above-described reflective layer. The conductive oxide layer may include indium tin oxide (ITO), indium zinc oxide (IZO), zinc oxide (ZnO), indium oxide (In203), indium gallium oxide (IGO), and/or aluminum doped zinc oxide (AZO). In an embodiment, the first electrode 221 may have a three-layer structure of an ITO layer/an Ag layer/an ITO layer.

A bank layer 211 may be arranged on the first electrode 221. An opening that overlaps the first electrode 221 is formed in the bank layer 211 and may cover an edge of the first electrode 221. The bank layer 211 may include an organic insulating material.

The intermediate layer 222 disposed on the first electrode 221 may include a light-emitting layer 222b. The intermediate layer 222 may include a first functional layer 222a arranged under the light-emitting layer 222b and/or a second functional layer 222c arranged on the light-emitting layer 222b. The light-emitting layer 222b may include a polymer or small molecular organic material that emits light of a certain color. The second functional layer 222c may include an electron transport layer (ETL) and/or an electron injection layer (EIL). The first functional layer 222a and the second functional layer 222c may include an organic material.

The second electrode 223 disposed on intermediate layer 222 may include a conductive material having a low work function. For example, the second electrode 223 may include a (semi-) transparent layer including Ag, Mg, Al, Pt, Pd, Au, Ni, Nd, Ir, chromium (Cr), lithium (Li), calcium (Ca) or an alloy thereof. Alternatively, the second electrode 223 may further include a layer such as ITO, IZO, ZnO or In203 on the (semi-) transparent layer including the above-described materials.

The light-emitting layer 222b may be formed in the display area DA to overlap the first electrode 221 through the opening of the bank layer 211. On the other hand, the first functional layer 222a, the second functional layer 222c, and the second electrode 223 may extend to be positioned in the middle area MA in addition to the display area DA.

A spacer 213 may be formed on the bank layer 211. The spacer 213 may be formed together in the same process as the bank layer 211 or may be formed separately in separate processes. In an embodiment, the spacer 213 may include an organic insulating material such as polyimide.

The organic light-emitting diode OLED may be covered by an encapsulation layer 300. The encapsulation layer 300 may include at least one organic encapsulation layer and at least one inorganic encapsulation layer. In an embodiment, FIG. 6 illustrates that the encapsulation layer 300 includes first and second inorganic encapsulation layers 310 and 330 and an organic encapsulation layer 320 arranged therebetween.

The first inorganic encapsulation layer 310 and the second inorganic encapsulation layer 330 may include one or more inorganic materials, such as aluminum oxide, titanium oxide, tantalum oxide, hafnium oxide, zinc oxide, silicon oxide, silicon nitride, and silicon oxynitride. The first inorganic encapsulation layer 310 and the second inorganic encapsulation layer 330 may have a single layer or multi-layered structure including the above-described materials. The organic encapsulation layer 320 may include a polymer-based material. The polymer-based material may include an acryl-based resin, an epoxy-based resin, polyimide, and polyethylene. In an embodiment, the organic encapsulation layer 320 may include acrylate.

The thicknesses of the first inorganic encapsulation layer 310 and the second inorganic encapsulation layer 330 may be different from each other. The thickness of the first inorganic encapsulation layer 310 may be greater than the thickness of the second inorganic encapsulation layer 330. Alternatively, the thickness of the second inorganic encapsulation layer 330 may be greater than the thickness of the first inorganic encapsulation layer 310, or the thicknesses of the first inorganic encapsulation layer 310 and the second inorganic encapsulation layer 330 may be the same.

The display panel 10 may include a substrate 100, an image generating layer 20 including a circuit-diode layer 200 and an encapsulation layer 300 arranged on the substrate 100 and including pixel circuits and display elements, and an input sensing layer 40 arranged on the image generating layer 20.

The input sensing layer 40 may include a first touch insulating layer 401 arranged on the second inorganic encapsulation layer 330, a first conductive layer 402 arranged on the first touch insulating layer 401, a second touch insulating layer 403 arranged on the first conductive layer 402, a second conductive layer 404 arranged on the second touch insulating layer 403, and a third touch insulating layer 405 arranged on the second conductive layer 404.

Each of the first touch insulating layer 401, the second touch insulating layer 403, and the third touch insulating layer 405 may include an inorganic insulating material and/or an organic insulating material. In an embodiment, the first touch insulating layer 401 and the second touch insulating layer 403 may include an inorganic insulating material, such as silicon oxide, silicon nitride and/or silicon oxynitride, and the third touch insulating layer 405 may include an organic insulating material.

The touch electrode TE of the input sensing layer 40 may have a structure in which the first conductive layer 402 and the second conductive layer 404 are connected to each other. Alternatively, the touch electrode TE may be formed on one of the first conductive layer 402 and the second conductive layer 404 and may include a metal line provided on a corresponding conductive layer. Each of the first conductive layer 402 and the second conductive layer 404 may include Al, Cu and/or Ti, and may have a single layer or multi-layered structure including the above-described materials. For example, each of the first conductive layer 402 and the second conductive layer 404 may have a three-layer structure of a Ti layer/an Al layer/a Ti layer.

Referring to the middle area MA of FIG. 6, the middle area MA may include a first sub-middle area SMA1 in which the bypass portions DL-C1 and DL-C2 of the data lines DL described above with reference to FIG. 5 pass.

The bypass portions DL-C1 and DL-C2 of the data lines DL may be arranged on different layers. One of the bypass portions DL-C1 and DL-C2 of the adjacent data lines DL may be arranged on the second interlayer insulating layer 207, and the other one thereof may be arranged on the first organic insulating layer 209.

When the bypass portions DL-C1 and DL-C2 of the data lines DL are alternately arranged with an insulating layer (e.g., a first organic insulating layer 209), a pitch Ad between the bypass portions DL-C1 and DL-C2 of the data lines DL may be changed (i. E., decreased or increased). Thus, the area of the middle area MA may be effectively utilized.

Figure 7:
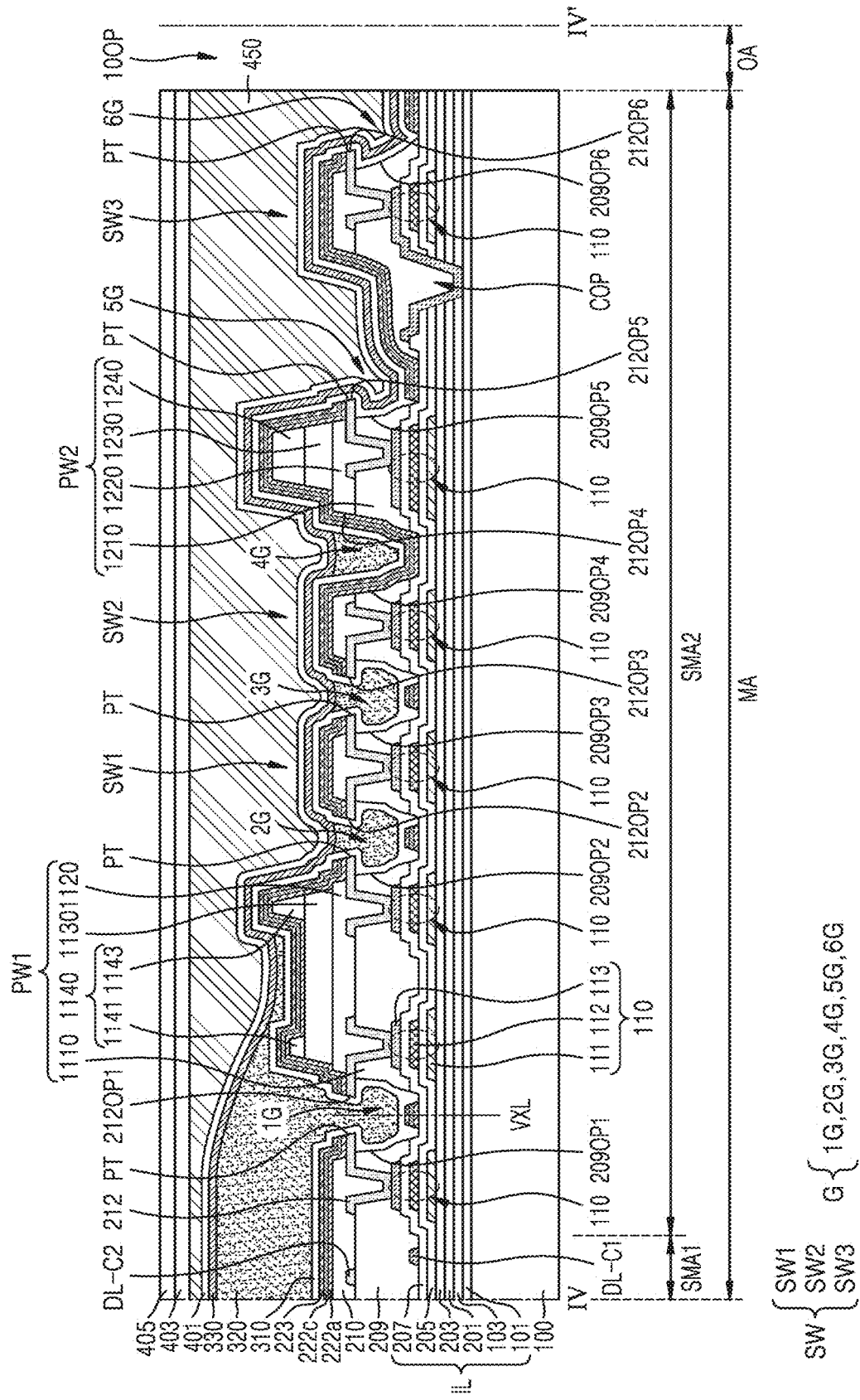
FIG. 7 is a cross-sectional view of a display panel according to an embodiment, taken along line IV-IV' of FIG. 5.

FIG. 7 is a cross-sectional view of a display panel according to an embodiment, taken along a line IV-IV' of FIG. 5.

Referring to FIGS. 6 and 7, the middle area MA may include a first sub-middle area SMA1 adjacent to the display area DA (refer to FIG. 6) and a second sub-middle area SMA2 adjacent to the opening area OA. The bypass portions DL-C1 and DL-C2 described with reference to FIG. 6 may be arranged in the first sub-middle area SMA1, and the bypass portions DL-C1 and DL-C2 of the data lines DL shown in the first sub-middle area SMA1 of FIG. 7 may correspond to bypass portions of some data lines among the data lines described above with reference to FIG. 6.

As depicted in FIG. 7, the bypass portions DL-C1 and DL-C2 of the data lines DL may be arranged in the first sub-middle area SMA1, and grooves G and partition walls may be arranged in the second sub-middle area SMA2, and the encapsulation layer 300 may extend in the middle area MA to cover the grooves G and the partition walls.

Referring to the second sub-middle area SMA2 of FIG. 7, the grooves G may be spaced apart from each other. In this regard, FIG. 7 illustrates that first through sixth grooves 1G, 2G, 3G, 4G, 5G, and 6G are arranged toward the opening area OA from the first sub-middle area SMA1. The first through sixth grooves 1G, 2G, 3G, 4G, 5G, and 6G may have a closed loop shape surrounding the opening area OA in a planar view, as described above with reference to FIG. 5. In an embodiment, the sixth groove 6G may overlap the opening area OA. For example, when viewed in a direction perpendicular to the substrate 100, the opening area OA may be inside the sixth groove 6G.

The grooves G may pass through at least one insulating layer formed on the substrate 100. For example, at least one insulating layer in which the grooves G are formed, may include a first organic insulating layer 209 and a second organic insulating layer 210. In this regard, FIG. 7 illustrates that the first through sixth grooves 1G, 2G, 3G, 4G, 5G, and 6G pass through the second organic insulating layer 210 and the first organic insulating layer 209. The grooves G, for example, the first through sixth grooves 1G, 2G, 3G, 4G, 5G, and 6G may be formed by removing portions of the second organic insulating layer 210 and the first organic insulating layer 209 by etching.

A plurality of inorganic insulating layers IL may be located directly under the grooves G. The plurality of inorganic insulating layers IL may include a first barrier layer 101, a second barrier layer 103, a buffer layer 201, a gate insulating layer 203, a first interlayer insulating layer 205, and a second interlayer insulating layer 207. For example, the grooves G may expose portions of the plurality of inorganic insulating layers IL. That is, a bottom surface of the grooves G may be an upper surface of one of the plurality of inorganic insulating layers IL. In this case, FIG. 7 illustrates that bottom surfaces of the first through sixth grooves 1G, 2G, 3G, 4G, 5G and 6G are the upper surface of the second interlayer insulating layer 207 located at the uppermost of the plurality of inorganic insulating layers IL. In other embodiments, portions of the second interlayer insulating layer 207 may be etched together by etching of the second organic insulating layer 210 and the first organic insulating layer 209 so that a recess or opening may also be formed.

When, as the embodiment of the present disclosure, the grooves G are formed on not the substrate 100 but the plurality of inorganic insulating layers IL, the effect of blocking moisture that may be introduced through the substrate 100 by the plurality of inorganic insulating layers IL may be shown. In this regard, FIG. 7 illustrates a structure in which the grooves G are formed on the first barrier layer 101, the second barrier layer 103, the buffer layer 201, the gate insulating layer 203, the first interlayer insulating layer 205 and the second interlayer insulating layer 207 so that the first barrier layer 101, the second barrier layer 103, the buffer layer 201, the gate insulating layer 203, the first interlayer insulating layer 205, and the second interlayer insulating layer 207 may effectively block moisture that may be introduced through the substrate 100.

At least one of the grooves G may include a tip PT. In an embodiment, as shown in FIG. 7, the first groove 1G, the second groove 2G, the third groove 3G, the fifth groove 5G, and the sixth groove 6G may include at least one tip PT. For example, the first groove 1G may have a pair of tips PT that are located at both sides of the first groove 1G with respect to a virtual vertical line VXL passing through the center of the first groove 1G. As in the first groove 1G, each of the second groove 2G and the third groove 3G may also have a pair of tips PT located at both sides of the second groove 2G and the third groove 3G with respect to a virtual vertical line passing through the center of each of the second groove 2G and the third groove 3G. On the other hand, each of the fifth groove 5G and the sixth groove 6G may include only one tip PT located in the second sub-middle area SMA2.

The tip PT may be provided on a metal pattern layer 212 located directly on the first organic insulating layer 209. The metal pattern layer 212 may include a metal such as the second electrode layer 170 including the data line DL and/or the driving voltage line PL described with reference to FIG. 6. For example, the metal pattern layer 212 may be the same layer as the second electrode layer 170. In an embodiment, the metal pattern layer 212 may have a three-layer structure of a Ti layer/an Al layer/a Ti layer.

A plurality of opening patterns 212OP that overlap the grooves G may be defined in the metal pattern layer 212 (or the second electrode layer 170). For example, the metal pattern layer 212 may have a first opening pattern 212OP1 that overlaps the first groove 1G, and a boundary between both sides of the first groove 1G defined by a first opening 209OP1 of the first organic insulating layer 209 may be arranged farther from a virtual vertical line VXL passing through the center of the first groove 1G than a boundary between both sides of the first opening pattern 212OP1. Thus, an end of each metal pattern layer 212 may protrude toward the center of the first groove 1G so that a tip PT may be formed. The tip PT that is a kind of eaves portion may protrude toward the center of the first groove 1G by passing through an inner surface of the first organic insulating layer 209 for forming an inner surface of the first groove 1G.

Similarly, a second opening pattern 212OP2 may be arranged to overlap the second groove 2G, and a third opening pattern 212OP3 may be arranged to overlap the third groove 3G. An end of each metal pattern layer 212 may protrude toward the centers of the second groove 2G and the third groove 3G so that a tip PT may be formed.

Unlike others, the fourth groove 4G may not include the tip PT. For example, a fourth opening pattern 212OP4 of the metal pattern layer 212 may overlap the fourth groove 4G, and a boundary between both sides of the fourth groove 4G may be arranged closer to a virtual vertical line passing through the center of the fourth groove 4G than a boundary between both sides of the fourth opening pattern 212OP4. Thus, an inner surface of the fourth opening 209OP4 of the first organic insulating layer 209 may be smoothly connected to an inner surface of the fourth opening 210OP4 of the second organic insulating layer 210.

The fifth groove 5G may include one tip PT located at a side of the second sub-middle area SMA2. For example, a fifth opening pattern 212OP5 of the metal pattern layer 212 may overlap the fifth groove 5G, and a boundary of a side of the first sub-middle area SMA1 of the fifth groove 5G may be arranged farther from a virtual vertical line passing through the center of the fifth groove 5G than a boundary of a side of the first sub-middle area SMA1 of the fifth opening pattern 212OP5, and a boundary of the other side of the fifth groove 5G may be arranged closer to the virtual vertical line passing through the center of the fifth groove 5G than a boundary of the other side of the fifth opening pattern 212OP5. Thus, a boundary of the side of the first sub-middle area SMA1 of the metal pattern layer 212 may protrude toward the center of the fifth groove 5G so that the tip PT may be formed.

The sixth groove 6G may include one tip PT located at the side of the second sub-middle area SMA2. For example, a sixth opening pattern 212OP6 of the metal pattern layer 212 may overlap the sixth groove 6G, and a boundary of the side of the first sub-middle area SMA1 of the sixth groove 6G may be arranged farther from a virtual vertical line passing through the center of the sixth groove 6G than a boundary of the side of the first sub-middle area SMA1 of the sixth opening pattern 212OP6. Thus, the boundary of the side of the first sub-middle area SMA1 of the metal pattern layer 212 may protrude toward the center of the sixth groove 6G so that the tip PT may be formed.

Some of layers included in the organic light-emitting diode OLED, for example, the first and second functional layers 222a and 222c that are organic material layers may be disconnected by the grooves G including the tip PT. The second electrode 223 may be disconnected or separated by the grooves G including the tip PT.

In this regard, FIG. 7 illustrates that the first and second functional layers 222a and 222c and the second electrode 223 are disconnected or separated by the tips PT of the first groove 1G, the second groove 2G, the third groove 3G, the fifth groove 5G, and the sixth group 6G. On the other hand, the first and second functional layers 222a and 222c and the second electrode 223 may not be disconnected by the fourth groove 4G but may be continuously formed. Moisture may proceed toward the display area DA (refer to FIG. 5) through the side surface of the opening 10OP of the display panel 10. The organic material layers that are continuously formed, for example, the first and second functional layers 222a and 222c may be used as passages of moisture described above. However, because, as shown in FIG. 7, the first and second functional layers 222a and 222c are disconnected by the grooves G including the tip PT, moisture may be prevented from proceeding toward the display area DA.

A metal dummy stack 110 may be arranged in the vicinity of the grooves G. For example, the metal dummy stack 110 may be arranged at both sides of the grooves G. The metal dummy stack 110 that is a kind of mound may be configured to increase the depth of the grooves G. In an embodiment, FIG. 7 illustrates that the metal dummy stack 110 includes three metal layers overlapping each other with the insulating layer therebetween, for example, the first through third metal layers 111, 112, and 113.

The first through third metal layers 111, 112, and 113 may be positioned on the same layer as electrodes of the first thin film transistor T1 and the storage capacitor Cst described above with reference to FIG. 6 and may include the same material. For example, the first metal layer 111 may be positioned on the same layer as the gate electrode GE (refer to FIG. 6), and may include the same material. The second metal layer 112 may be positioned on the same layer as the upper electrode CE2 (refer to FIG. 6) of the storage capacitor, and may include the same material. The third metal layer 113 may be positioned on the same layer as the first electrode layer 160 including connection nodes and the bypass portion DL-C2 of the data lines DL, and may include the same material.

FIG. 7 illustrates that the metal dummy stack 110 includes three metal layers overlapping each other with an insulating layer therebetween. However, embodiments are not limited thereto. In another embodiment, the number of metal layers of the metal dummy stack 110 may be less than or greater than 3.

In an embodiment, an opening COP formed by etching a portion of at least one inorganic insulating layer of the plurality of inorganic insulating layers IL may be defined in the sixth groove 6G. In this regard, FIG. 7 illustrates that portions of the second barrier layer 103, the buffer layer 201, the gate insulating layer 203, the first interlayer insulating layer 205, and the second interlayer insulating layer 207 among the plurality of inorganic insulating layers IL may be etched so that the opening COP may be formed. However, embodiments are not limited thereto. In this case, one of a plurality of metal layers including in the metal dummy stack 110 may extend to cover the opening COP. FIG. 7 illustrates that the third metal layer 113 may extend to cover the opening COP. However, embodiments are not limited thereto.

The opening COP may be configured to separate inorganic insulating layers IL at the side close to the first sub-middle area SMA1 from inorganic insulating layers IL at the side close to the opening area OA. Thus, cracks generated in inorganic insulating layers IL at the side close to the opening area OA when the opening 10OP of the display panel 10 is formed, may be prevented from propagating into inorganic insulating layers IL at the side close to the first sub-middle area SMA1. In this case, one of a plurality of metal layers that constitute the metal dummy stack 110 may cover the opening COP of the plurality of inorganic insulating layers IL to block a vapor permeance passage through which moisture or the like is transmitted to the substrate 100 from the first organic insulating layer 209 through the opening COP.

Some of the grooves G, for example, the fourth groove 4G may not include the tip PT. The fourth groove 4G may be used in monitoring of the organic encapsulation layer 320 of the encapsulation layer 300.

The organic encapsulation layer 320 may be formed by coating a monomer and then by curing the monomer. Because the monomer has fluidity, controlling the position of the monomer is one of important factors during the manufacture of the display panel 10. The position of the organic encapsulation layer 320 may be measured using the amount of light that is irradiated onto the display panel 10 and then reflected. Because the tip PT including metal affects the reflectivity of light used during monitoring of the organic encapsulation layer 320, when all of the grooves G include the tip PT, it is difficult to perform position tracking of the organic encapsulation layer 320. However, the display panel 10 according to an embodiment may include the fourth groove 4G that does not include the tip PT and/or a groove having the tip PT formed only at one side of the display panel 10 so that the above-described problems may be prevented or minimized.

Partition walls in addition to the above-described grooves G may be positioned in the middle area MA. In this regard, FIG. 7 illustrates a first partition wall PW1 and a second partition wall PW2. The grooves G may be arranged in the second sub-middle area SMA2 to be spaced apart from each other. The first groove 1G may be arranged between the first partition wall PW1 and the first sub-middle area SMA1. In other word, the first groove 1G may be arranged between the first partition wall PW1 and a display area DA (refer to FIG. 5). The second groove 2G, the third groove 3G, and the fourth groove 4G may be arranged between the first partition wall PW1 and the second partition wall PW2, and the fifth groove 5G and the sixth groove 6G may be arranged between the second partition wall PW2 and the opening area OA.

Sub-partition walls SW for separating the grooves G may be arranged between the first partition wall PW1 and the second partition wall PW2. For example, a first sub-partition wall SW1 may be arranged between the second groove 2G and the third groove 3G, and a second sub-partition wall SW2 may be arranged between the third groove 3G and the fourth groove 4G. Similarly, a third sub-partition wall SW3 may be arranged between the fifth groove 5G and the sixth groove 6G.

The grooves G arranged between the first partition wall PW1 and the second partition wall PW2 may be covered by the organic encapsulation layer 320. In this regard, FIG. 7 illustrates that the second groove 2G, the third groove 3G and the fourth groove 4G are covered by the organic encapsulation layer 320 in a region between the first partition wall PW1 and the second partition wall PW2. In an embodiment, the organic encapsulation layer 320 may bury the tips PT of the grooves G between the first partition wall PW1 and the second partition wall PW2. For example, a pair of tips PT arranged at both sides of the second groove 2G and the third groove 3G may be sufficiently covered by the organic encapsulation layer 320 respectively up to upper surfaces of the pair of tips PT. When the tips PT of the grooves G between the first partition wall PW1 and the second partition wall PW2 are not buried by the organic encapsulation layer 320, contact of the inorganic layers may occur on the tips PT. In this case, cracks may occur in a contact region between the metal pattern layer 212, the first inorganic encapsulation layer 310, and the second inorganic encapsulation layer 330. Thus, the organic encapsulation layer 320 may be configured to bury the tips T so that the above-described problems may be prevented or minimized.

The first inorganic encapsulation layer 310 of the encapsulation layer 300 may be configured to cover inner surfaces of the grooves G, and the organic encapsulation layer 320 may cover the first sub-middle area SMA1 and may cover a portion of the second sub-middle area SMA2. The organic encapsulation layer 320 may be configured to cover portions of the grooves G, for example, the first groove 1G, and the second through fourth grooves 2G, 3G, and 4G between the first partition wall PW1 and the second partition wall PW2. The second inorganic encapsulation layer 330 may be configured to entirely cover the middle area MA on the organic encapsulation layer 320.

The first partition wall PW1 may include a plurality of protrusions so as to control the flow of monomer when the organic encapsulation layer 320 is formed. In an embodiment, FIG. 7 illustrates that the first partition wall PW1 includes first and second protrusions 1141 and 1143, which are spaced apart from each other. In an embodiment, the height of the first partition wall PW1 may be asymmetrically formed. For example, the height of the first protrusion 1141 may be smaller than the height of the second protrusion 1143 so that a margin for an inkjet printing process may be secured. The second protrusion 1143 may protrude onto the organic encapsulation layer 320 to disconnect or separate the organic encapsulation layer 320. On the second protrusion 1143, a portion of the second inorganic encapsulation layer 330 may be in direct contact with a portion of the first inorganic encapsulation layer 310.

In the middle area MA, the organic encapsulation layer 320 may be discontinuous due to the structure of the first partition wall PW1. For example, a portion of the organic encapsulation layer 320 may be configured to cover the display area DA and the first sub-middle area SMA1, as shown in FIGS. 6 and 7, and the other portion of the organic encapsulation layer 320 may be configured to cover a region between the first partition wall PW1 and the second partition wall PW2. That is, an end of the organic encapsulation layer 320 may be positioned at one side of the second partition wall PW2, may pass through the second partition wall PW2 and may not extend into the opening area OA. Thus, a portion of the second inorganic encapsulation layer 330 may be in direct contact with a portion of the first inorganic encapsulation layer 310 on an upper surface of the second partition wall PW2. The second inorganic encapsulation layer 330 may be in direct contact with the first inorganic encapsulation layer 310 between the second partition wall PW2 and the opening area OA.

Touch insulating layers described with reference to FIG. 6 may extend through the middle area MA. In this regard, FIG. 7 illustrates a structure in which the first through third touch insulating layers 401, 403 and 405 extend in the middle area MA.

A planarization layer 450 may be located in the middle area MA. The planarization layer 450 may be configured to planarize the middle area MA. The planarization layer 450 may be located in the middle area MA and may be configured to cover a structure under the planarization layer 450.

Referring to FIGS. 6 and 7, the planarization layer 450 may be located only in the middle area MA and may not be present in the display area DA. In this regard, FIG. 6 illustrates that an outer edge 450e of the planarization layer 450 is not positioned in the display area DA. A process of forming the planarization layer 450 may be performed between the process of forming a first touch insulating layer 401 and a process of forming a second touch insulating layer 403. Thus, in the display area DA adjacent to the outer edge 450e of the planarization layer 450, the first touch insulating layer 401 and the second touch insulating layer 403 may be in direct contact with each other.

Referring to the opening area OA of FIG. 7, the display panel 10 (refer to FIG. 3) may include an opening 10OP (refer to FIG. 5). The opening 10OP of the display panel 10 may include openings for elements of the display panel 10. For example, the opening 10OP of the display panel 10 may include an opening for the substrate 100, openings for the first and second inorganic encapsulation layers 310 and 330 of the encapsulation layer 300, and an opening for the planarization layer 450.

The openings for the elements of the display panel 10 may be simultaneously formed. Thus, an inner surface of the substrate 100 for defining the opening of the substrate 100 and an inner surface of the planarization layer 450 for defining the opening of the planarization layer 450 may be located in the same virtual vertical line.

FIGS. 8, 9, 10, 11, and 12 are cross-sectional views of a display panel according to a process of manufacturing the display panel according to an embodiment.

Figure 8:
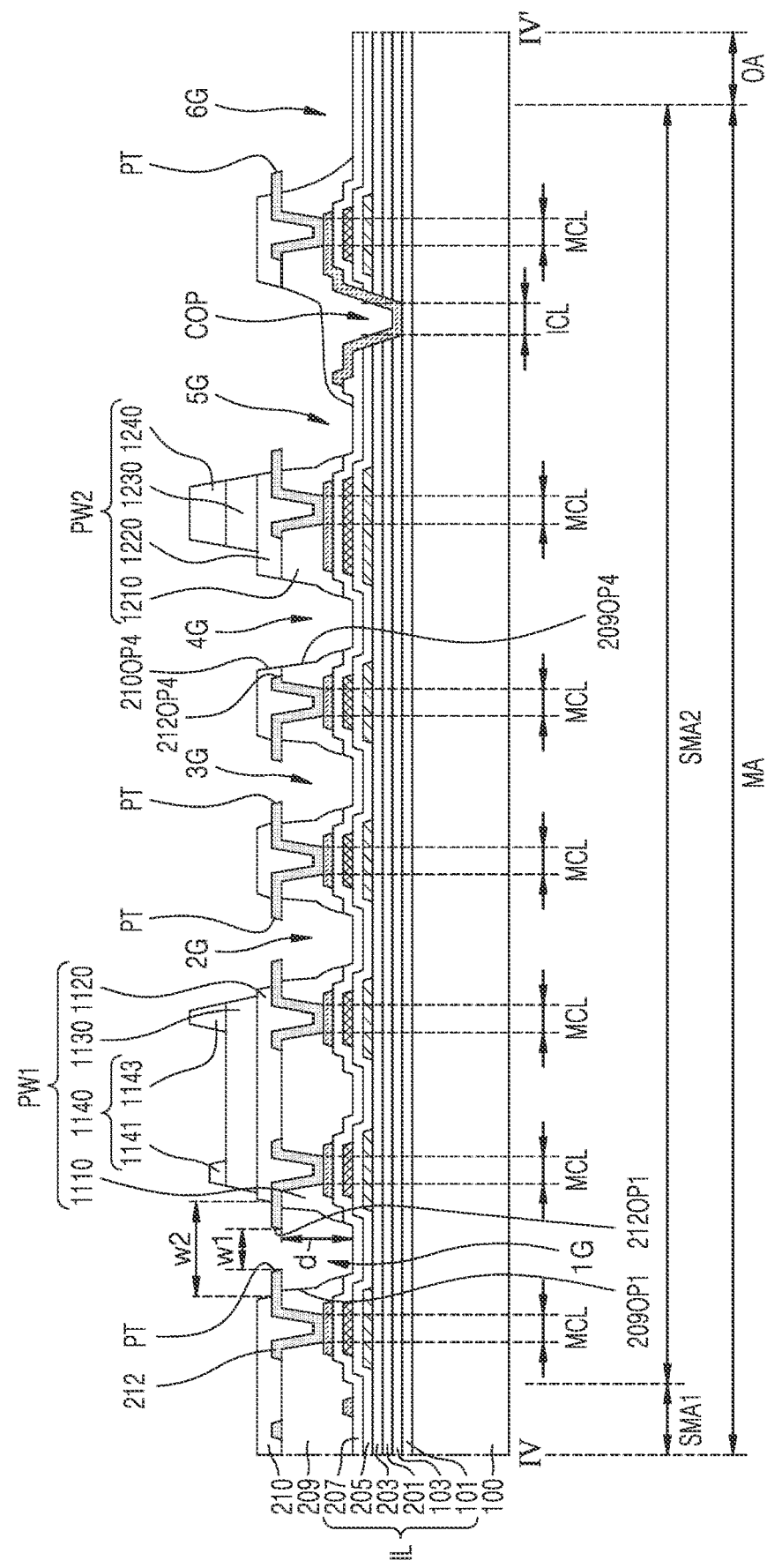
FIGS. 8 through 12 are cross-sectional views of a display panel according to a process of manufacturing the display panel according to an embodiment.

Referring to FIG. 8, the first through sixth grooves 1G, 2G, 3G, 4G, 5G, and 6G and the first through second partition walls PW1 and PW2 may be formed in the middle area MA, for example, in the second sub-middle area SMA2.

The first through sixth grooves 1G, 2G, 3G, 4G, 5G, and 6G may be formed by passing through at least one insulating layer. For example, the first through sixth grooves 1G, 2G, 3G, 4G, 5G, and 6G may be formed by penetrating through the first organic insulating layer 209 and the second organic insulating layer 210. Each of the first through sixth grooves 1G, 2G, 3G, 4G, 5G, and 6G may be formed by etching portions of the first organic insulating layer 209 and the second organic insulating layer 210. In this case, portions of the plurality of inorganic insulating layers IL may be exposed by the first through sixth grooves 1G, 2G, 3G, 4G, 5G, and 6G.

Portions of the grooves G, for example, the first groove 1G, the second groove 2G, and the third groove 3G may include a pair of tips PT that protrude toward the center of each group. The fifth groove 5G and the sixth groove 6G may include one tip PT.

The tip PT that is one end of the metal pattern layer 212 arranged directly on the first organic insulating layer 209 may protrude toward the center of a corresponding groove.

Referring to the first groove 1G, a boundary of the first opening pattern 212OP1 of the metal pattern layer 212 may be closer to the center of the first groove 1G than a boundary of the first opening 209OP1 of the first organic insulating layer 209 for defining an inner surface of the first groove 1G. That is, a width W1 of the first opening pattern 212OP1 may be smaller than a width W2 of the first opening 209OP1 of the first organic insulating layer 209. Thus, the tip PT may protrude toward the center of the first groove 1G.

Similarly in the first groove 1G, the second groove 2G and the third groove 3G may include a pair of tips PT that face each other. On the other hand, the fifth groove 5G and the sixth groove 6G may include one tip PT that protrudes toward the center of each of the fifth groove 5G and the sixth groove 6G.

In an embodiment, a boundary between both sides of the fourth opening pattern 212OP4 of the metal pattern layer 212 may be farther from the center of the fourth groove 4G than a boundary of the fourth groove 4G. Thus, the fourth groove 4G may not include the tip PT.

Figure 9:
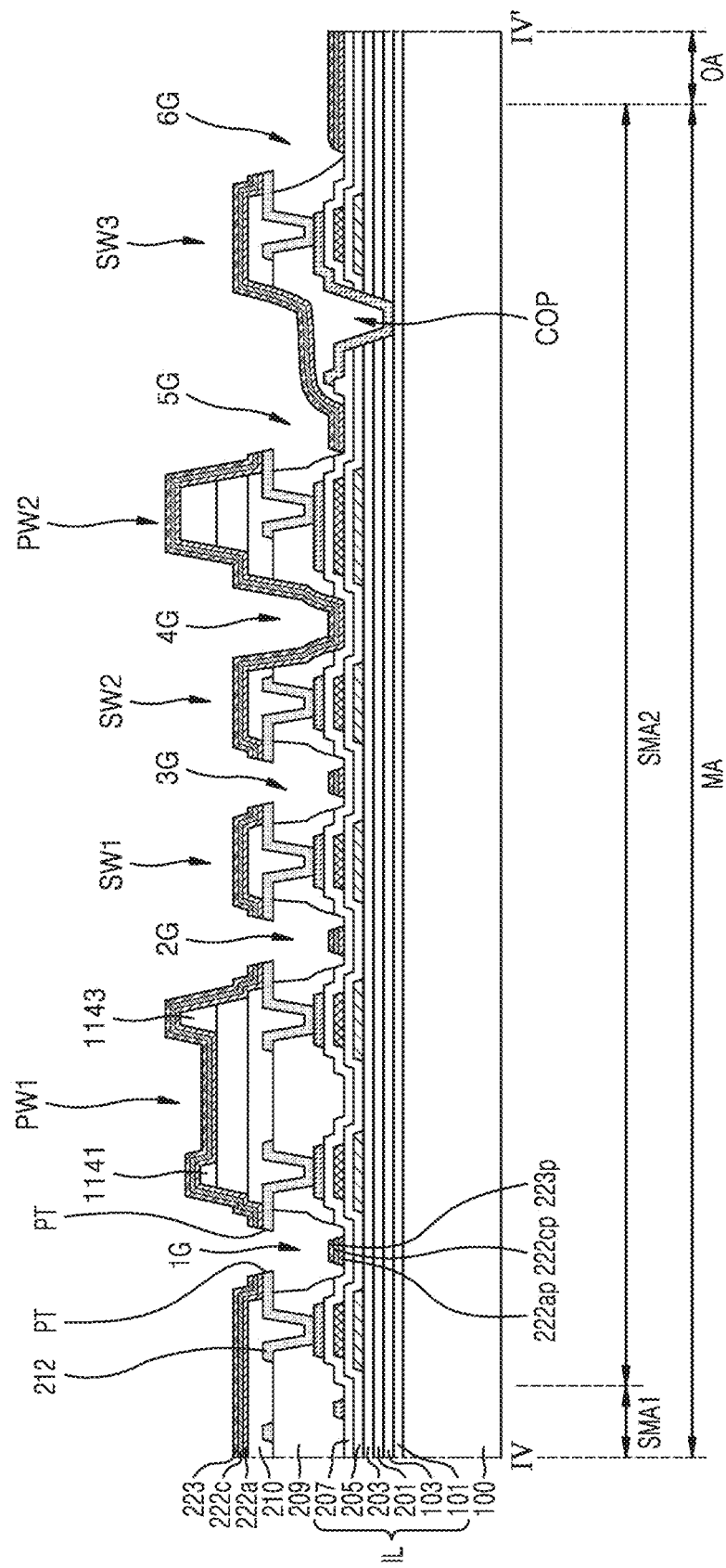

A metal dummy stack 110 (shown in FIG. 7) may be arranged in the vicinity of the first through fifth grooves 1G, 2G, 3G, 4G, and 5G. The metal dummy stack 110 may be arranged at each of both sides of the first through fifth grooves 1G, 2G, 3G, 4G, and 5G with a virtual vertical line passing through each of the first through fifth grooves 1G, 2G, 3G, 4G, and 5G. For example, a first sub-partition wall SW1 for separating the second groove 2G and the third groove 3G, a second sub-partition wall SW2 for separating the third groove 3G and the fourth groove 4G, and a third sub-partition wall SW3 for separating the fifth groove 5G and the sixth groove 6G may overlap the metal dummy stack 110, as shown in FIG. 9. Similarly, the first partition wall PW1 for separating the first groove 1G and the second groove 2G and the second partition wall PW2 for separating the fourth groove 4G and the fifth groove 5G may also overlap the metal dummy stack 110. The metal dummy stack 110 that is a kind of dummy stack including a plurality of metal layers 111, 112 and 113 overlapping each other with inorganic insulating layers therebetween as shown in FIG. 7 may be configured to increase the heights of the first partition wall PW1, the second partition wall PW2, the first sub-partition wall SW1, the second sub-partition wall SW2, and the third sub-partition wall SW3. Thus, the height of each of the first through fifth grooves 1G, 2G, 3G, 4G, and 5G may be increased.

The metal dummy stack 110 may include first through third metal layers 111, 112, and 113, and materials for forming the first through third metal layers 111, 112, and 113 are as described above with reference to FIG. 7.

The metal pattern layer 212 may be in direct contact with an uppermost layer of the metal dummy stack 110, for example, the third metal layer 113. The metal pattern layer 212 may be in direct contact with an upper surface of the third metal layer 113 through a through hole of the first organic insulating layer 209. A metal contact region MCL formed when the metal pattern layer 212 and the metal dummy stack 110 are in direct contact with each other, may be arranged adjacent to each of the grooves G (refer to FIG. 7). For example, metal contact regions MCL may be arranged at both sides of the first and second grooves 1G and 2G, and the metal contact region MCL may be arranged at one side of each of the third and fourth grooves 3G and 4G. In this way, at least one metal contact region MCL may be arranged between the adjacent grooves F. The metal contact region MCL may be formed in a thickness direction of the first organic insulating layer 209 so that proceeding of moisture through the first organic insulating layer 209 may be blocked.

The sixth groove 6G may have an opening COP formed by etching a portion of at least one inorganic insulating layer of the plurality of inorganic insulating layers IL. FIG. 8 illustrates that some of the second barrier layer 103, the buffer layer 201, the gate insulating layer 203, the first interlayer insulating layer 205 and the second interlayer insulating layer 207 among the plurality of inorganic insulating layers IL are etched so that the opening COP may be formed. However, embodiments are not limited thereto. One of a plurality of metal layers including in the metal dummy stack 110 may extend to cover the opening COP. In an embodiment, the third metal layer 113 among the plurality of metal layers may extend to cover the opening COP. The third metal layer 113 may be in direct contact with the inorganic insulating layers IL so that a metal-inorganic contact region ICL may be formed and thus moisture may be prevented from propagating into the substrate 100 from the first organic insulating layer 209, or propagation of the moisture may be reduced.

The first partition wall PW1 may be arranged between the first groove 1G and the second groove 2G. The first partition wall PW1 may include first through fourth partition wall layers 1110, 1120, 1130, and 1140. The first through fourth partition wall layers 1110, 1120, 1130, and 1140 may include the same material as that of the first organic insulating layer 209, the second organic insulating layer 210, the bank layer 211, and the spacer 213, respectively. A first protrusion 1141 and a second protrusion 1143 may be formed on the fourth partition wall layer 1140. Thus, the first protrusion 1141 and the second protrusion 1143 may include the same material as that of the spacer 213.

As described above, the heights of the first protrusion 1141 and the second protrusion 1143 may be different from each other. That is, the height of the second protrusion 1143 may be greater than the height of the first protrusion 1141. As the heights of the first protrusion 1141 and the second protrusion 1143 are asymmetrically formed, a margin for an inkjet printing process may be secured.

The second partition wall PW2 may be spaced apart from the first partition wall PW1 and may be arranged between the first partition wall PW1 and the opening area OA. The second partition wall PW2 may include first through fourth partition wall layers 1210, 1220, 1230, and 1240. The first through fourth partition wall layers 1210, 1220, 1230, and 1240 may include the same material as that of the first organic insulating layer 209, the second organic insulating layer 210, the bank layer 211, and the spacer 213, respectively.

The second partition wall PW2 may be arranged on the metal dummy stack 110. The height of the second partition wall PW2 may be the same as or greater than that of the first partition wall PW1. In an embodiment, FIG. 8 illustrates that the height of the second partition wall PW2 is the same as the height of the second protrusion 1143 of the first partition wall PW1. Each of the first partition wall PW1 and the second partition wall PW2 may have a closed loop shape that entirely surrounds the opening area OA in a planar view. Because the first partition wall PW1 has a closed loop shape that entirely surrounds the opening area OA in a planar view, the first through second protrusions 1141 and 1143 may have a closed loop shape that entirely surrounds the opening area OA in a planar view. Similarly, the first sub-partition wall SW1, the second sub-partition wall SW2, and the third sub-partition wall SW3 may have a closed loop shape that entirely surrounds the opening area OA in a planar view.

Referring to FIG. 9, first and second functional layers 222a and 222c and a second electrode 223 of the organic light-emitting diode OLED (refer to FIG. 6) may be formed on the substrate 100 in which the first through sixth grooves 1G, 2G, 3G, 4G, 5G and 6G and the first and second partition walls PW1 and PW2 are formed. The first and second functional layers 222a and 222c and the second electrode 223 may be formed through thermal deposition. As described above with reference to FIG. 6, each of the first and second functional layers 222a and 222c and the second electrode 223 may also be deposited in the middle area MA. However, because each of the first groove 1G, the second groove 2G, the third groove 3G, the fifth groove 5G and the sixth groove 6G formed in the middle area MA includes a tip PT having an eaves structure, each of the first and second functional layers 222a and 222c and the second electrode 223 may be disconnected from the tip PT.

In this regard, FIG. 9 illustrates a portion 222ap of the first functional layer 222a that is arranged on the bottom surface of each of the first groove 1G, the second groove 2G and the third groove 3G and is discontinuous with the first functional layer 222a placed on the tip PT. Similarly, a portion 222cp of the second functional layer 222c and a portion 223p of the second electrode 223 on the bottom surface of each of the first groove 1G, the second groove 2G, and the third groove 3G may be discontinuous with the second functional layer 222c and the second electrode 223 placed on the tip PT.

Because the fourth groove 4G does not include the tip PT, the first and second functional layers 222a and 222c and the second electrode 223 may continuously cover the inner surface of the fourth groove 4G.

The fifth groove 5G and the sixth groove 6G may include one tip PT, and the first and second functional layers 222a and 222c and the second electrode 223 may be disconnected under the tip PT. An inner surface in which the tip PT of each of the fifth groove 5G and the sixth groove 6G is not formed based on a virtual vertical line passing through the centers of the fifth groove 5G and the sixth groove 6G, may be covered by the first and second functional layers 222a and 222c and the second electrode 223.

Figure 10:
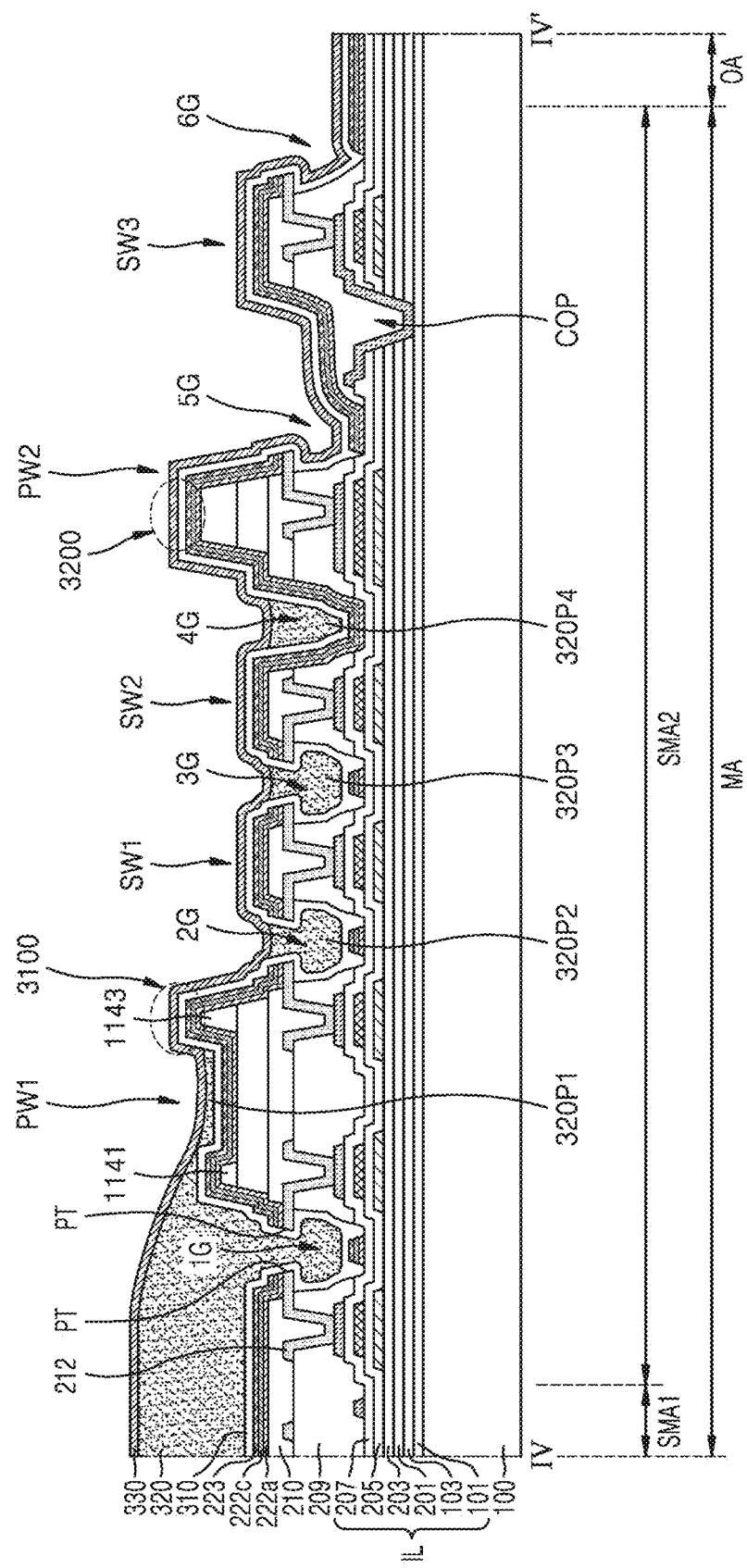

Referring to FIG. 10, an encapsulation layer 300 (refer to FIG. 6) may be formed. Because the first inorganic encapsulation layer 310 may be formed through chemical vapor deposition and has a relatively high step coverage, the first inorganic encapsulation layer 310 may be configured to cover the inner surfaces of the first through sixth grooves 1G, 2G, 3G, 4G, 5G, and 6G continuously, and when the tip PT is formed in the grooves G, the lower surface of the tip PT may also be continuously covered. The first inorganic encapsulation layer 310 may be configured to cover the side surface and the upper surface of the first partition wall PW1 continuously and may be configured to cover the side surface and the upper surface of the second partition wall PW2 continuously. Similarly, the first inorganic encapsulation layer 310 may be configured to cover the side surface and the upper surface of each of the first sub-partition wall SW1, the second sub-partition wall SW2, and the third sub-partition wall SW3 continuously.

Subsequently, an organic encapsulation layer 320 may be formed by coating and curing monomer. The monomer may be coated in an inkjet manner. The monomer may be coated so that a portion of the monomer is present between the first partition wall PW1 and the second partition wall PW2, and flow of the monomer may be controlled by the first protrusion 1141 and the second protrusion 1143 located on an upper portion of the first partition wall PW1. The monomer may be present in a recess between the first protrusion 1141 and the second protrusion 1143, and when the monomer in the recess is cured, a portion 320P of the organic encapsulation layer 320 including the first through fourth portion 320P1, 320P2, 320P3, and 320P4 may be located in the recess.

It is difficult that the monomer is present on an upper surface of a protrusion of the first partition wall PW1 close to the second partition wall PW2, for example, the second protrusion 1143. Thus, a portion of the second inorganic encapsulation layer 330 to be formed after the organic encapsulation layer 320 may be in direct contact with a portion of the first inorganic encapsulation layer 310 on the first partition wall PW1, for example, on the second protrusion 1143. In this regard, FIG. 10 illustrates that an inorganic contact region (hereinafter, a first inorganic contact region 3100) in which a portion of the second inorganic encapsulation layer 330 and a portion of the first inorganic encapsulation layer 310 are in direct contact with each other, is present on a portion of the upper surface of the first partition wall PW1.

The inorganic contact region formed when the second inorganic encapsulation layer 330 and the first inorganic encapsulation layer 310 are in direct contact with each other, may also be present on the second partition wall PW2. The organic encapsulation layer 320 may not extend toward the opening area OA while passing through the second partition wall PW2, and a portion of the second inorganic encapsulation layer 330 on the upper surface of the second partition wall PW2 may be in direct contact with a portion of the first inorganic encapsulation layer 310 so that a second inorganic contact region 3200 may be formed.

A portion of the organic encapsulation layer 320 may be present in the first groove 1G, the second groove 2G, the third grove 3G, and the fourth groove 4G. On the other hand, a material corresponding to the organic encapsulation layer 320 may not be present in the fifth groove 5G and the sixth groove 6G adjacent to the opening area OA than the second partition wall PW2, and the second inorganic encapsulation layer 330 may be in contact with the first inorganic encapsulation layer 310 and an inner surface of each of the fifth groove 5G, and the sixth groove 6G.

Figure 11:
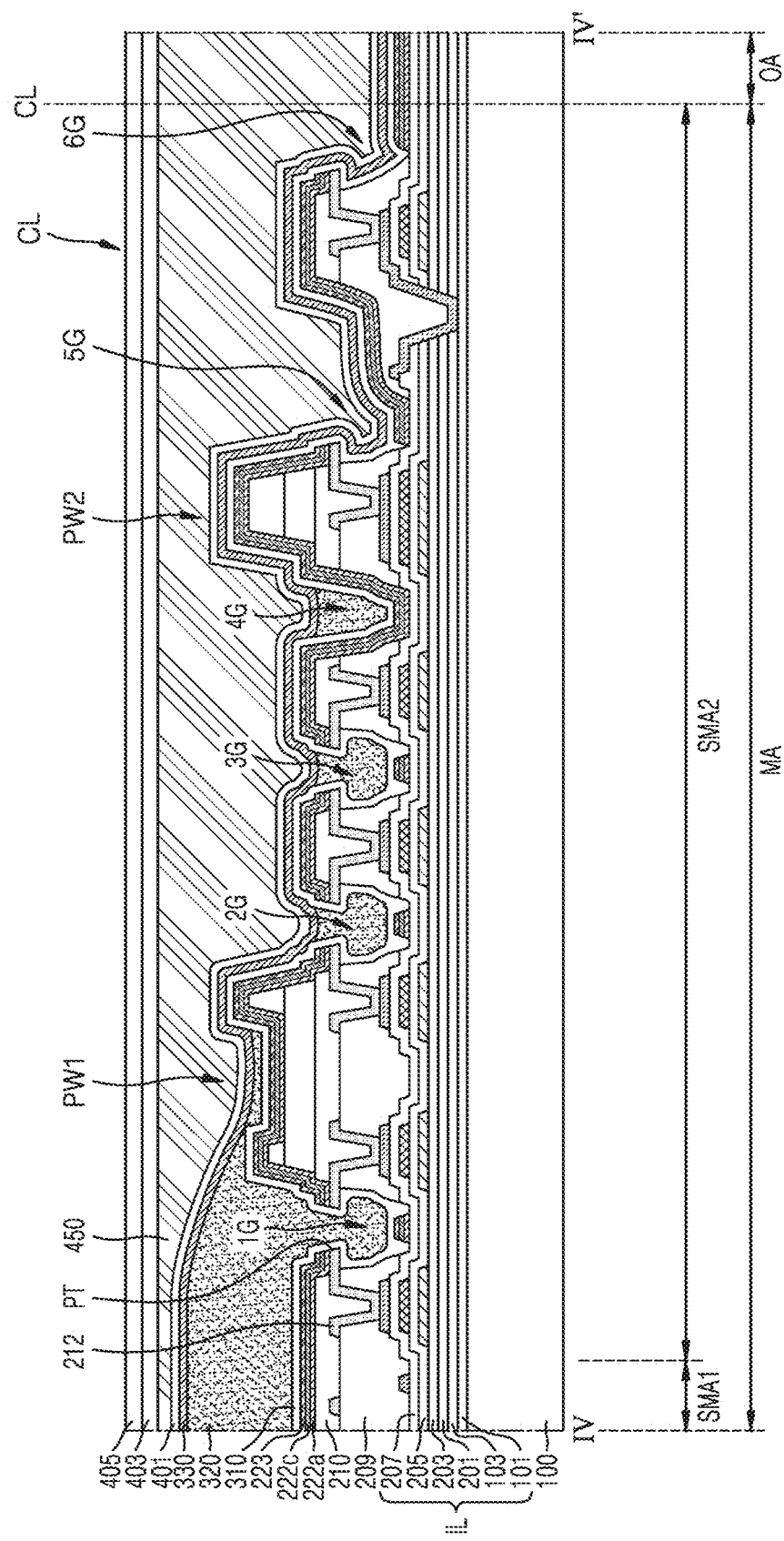

Referring to FIG. 11, each of a first touch insulating layer 401, a planarization layer 450, a second touch insulating layer 403, and a third touch insulating layer 405 may be formed on the encapsulation layer 300 (refer to FIG. 6). A portion of the planarization layer 450 may be present in the fifth groove 5G and the sixth groove 6G. Although not shown in FIG. 11, a first conductive layer 402 (refer to FIG. 6) may be formed between the first touch insulating layer 401 and the second touch insulating layer 403, and a second conductive layer 404 (refer to FIG. 6) may be formed between the second touch insulating layer 403 and the third touch insulating layer 405.

Figure 12:
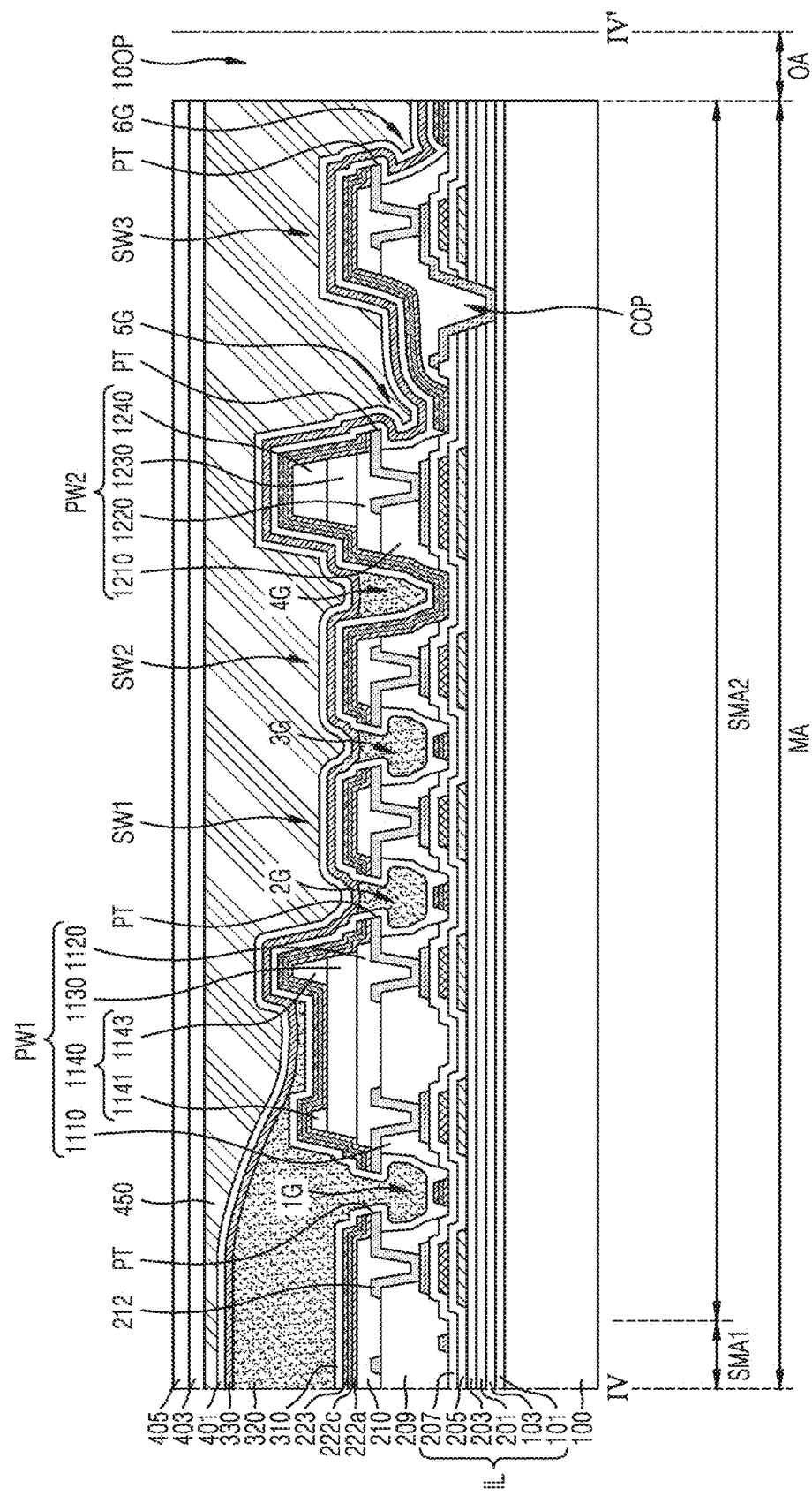

Thereafter, when elements positioned in the opening area OA along a cutting line CL are removed using a laser beam, an opening 10OP of the display panel 10 may be formed in the opening area OA, as shown in FIGS. 3, 5 and 12.

Figure 13:
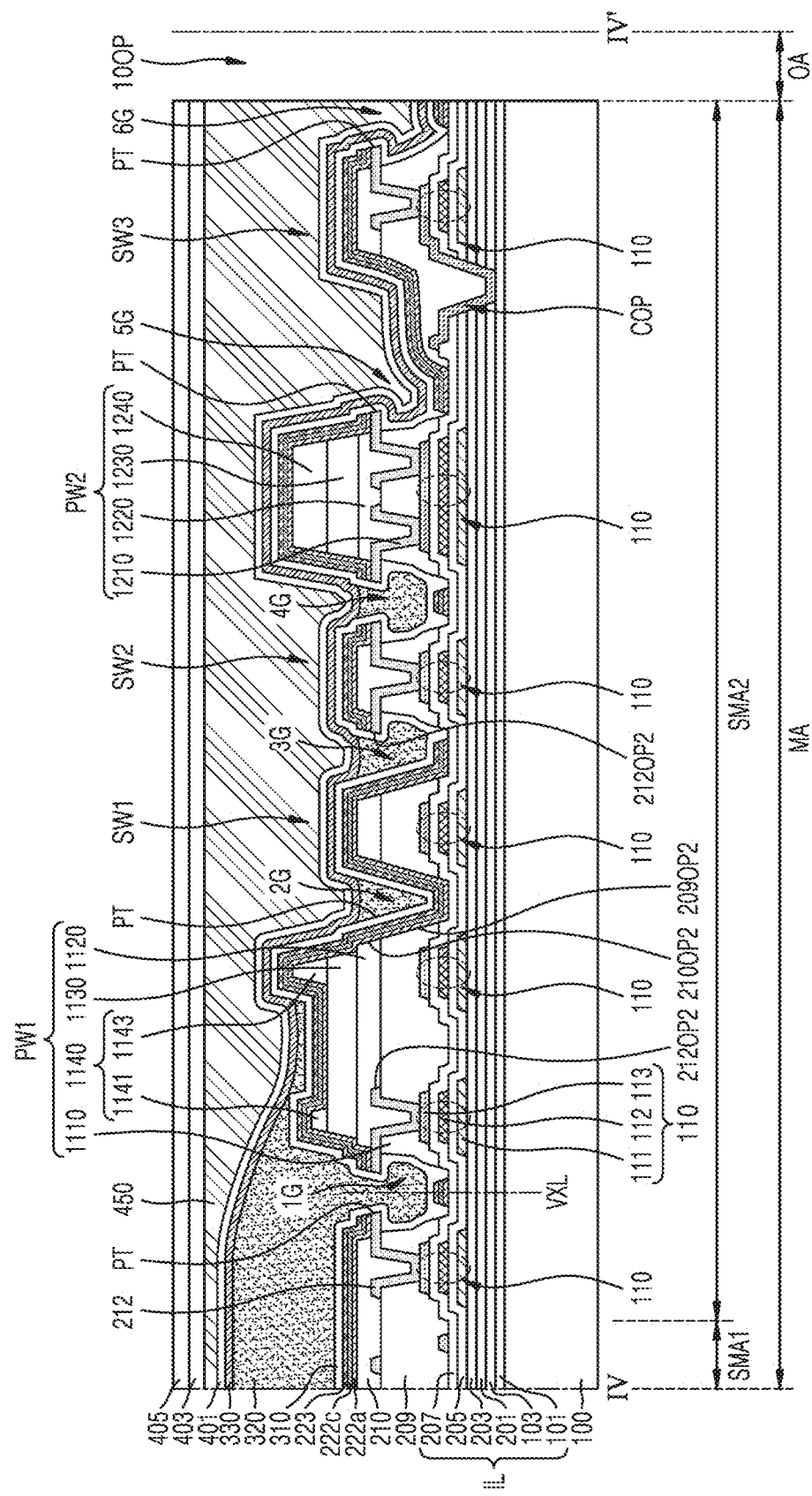
FIGS. 13 and 14 are cross-sectional views of a display panel according to other embodiments.
Figure 14:
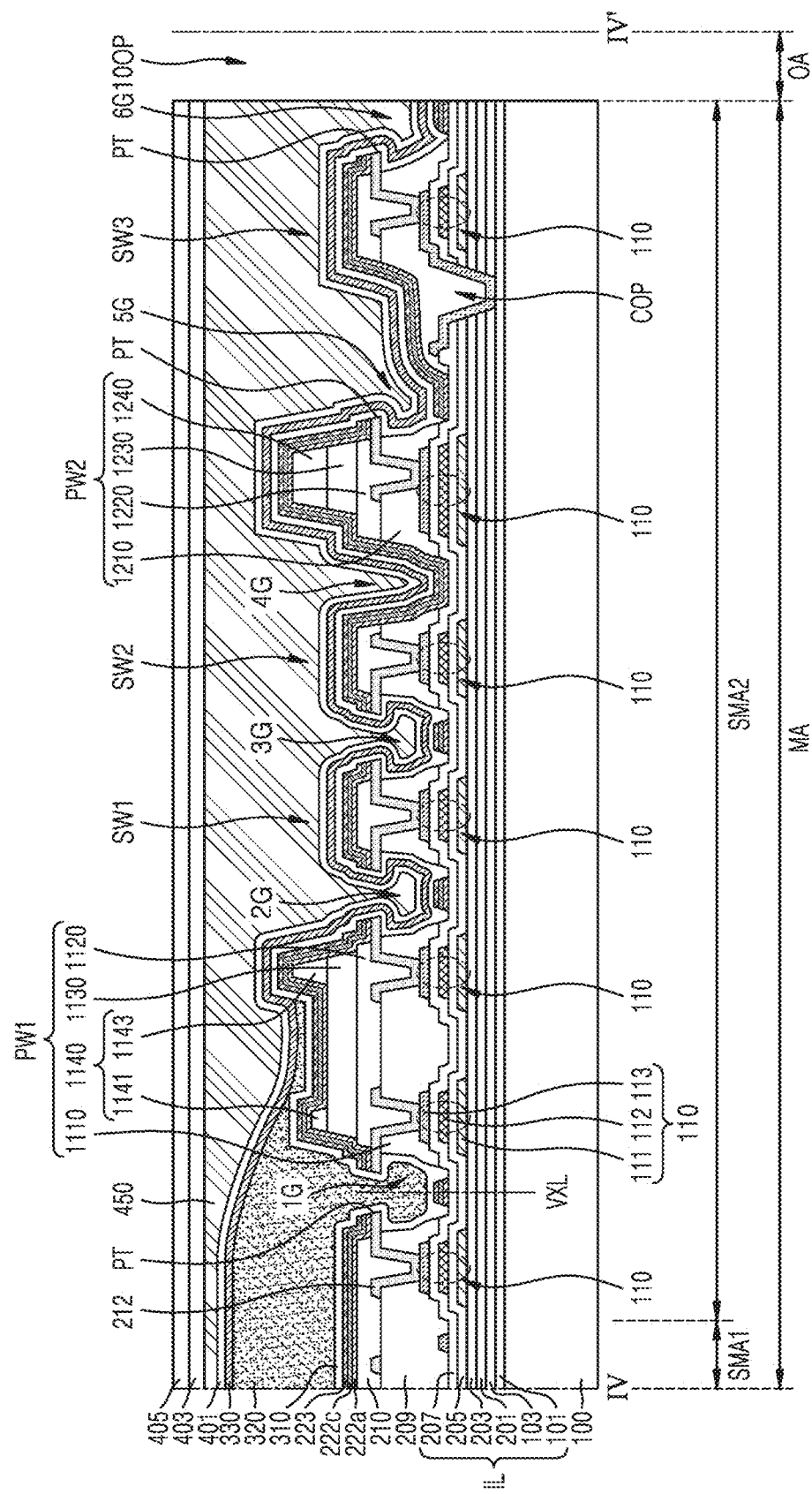

FIGS. 13 and 14 are cross-sectional views of a display panel according to other embodiments.

Referring to FIG. 13, a second opening 212OP2 of the metal pattern layer 212 may overlap the second groove 2G and the third groove 3G. For example, a boundary between both sides of the second opening 209OP2 of the first organic insulating layer 209 for defining a boundary of the second groove 2G may be closer to a virtual vertical line passing through the center of the second groove 2G than a boundary between both sides of the second opening pattern 212OP2 of the metal pattern layer 212. Thus, the second opening 209OP2 of the first organic insulating layer 209 and the second opening 210OP2 of the second organic insulating layer 210 may form an inner surface of the second groove 2G that succeeds smoothly.

Similarly, a boundary of one side of the third groove 3G may be closer to a virtual vertical line passing through the center of the third groove 3G than a boundary of one side of the second opening pattern 212OP2 of the metal pattern layer 212. On the other hand, a boundary of the other side of the third groove 3G may be farther from the virtual vertical line passing through the center of the third groove 3G than a boundary of the other side of the second opening pattern 212OP2 of the metal pattern layer 212. Thus, the third groove 3G may include one tip PT that protrudes toward the center of the third groove 3G.

Because both sides of the second groove 2G and one side of the third groove 3G do not include the tip PT, the position of the organic encapsulation layer 320 may be easily monitored.

Each of the first groove 1G and the fourth groove 4G may include a pair of tips PT protruding toward the center of corresponding one of the first groove 1G and the fourth groove 4G, and each of the fifth groove 5G and the sixth groove 6G may include one tip PT protruding toward the center of corresponding one of the fifth groove 5G and the sixth groove 6G. Thus, the first and second functional layers 222a and 222c and the second electrode 223 arranged on the bottom surface of each of the first groove 1G, the third groove 3G, the fourth groove 4G, the fifth groove 5G, and the sixth groove 6G may be discontinuous with the first and second functional layers 222a and 222c and the second electrode 223 placed on each tip PT.

Referring to FIG. 14, the organic encapsulation layer 320 may not exceed the first partition wall PW1. For example, the organic encapsulation layer 320 may cover the first groove 1G, but may not cover the second through sixth grooves 2G, 3G, 4G, 5G, and 6G located between the first partition wall PW1 and the opening area OA. When the second through sixth grooves 2G, 3G, 4G, 5G and 6G located between the first partition wall PW1 and the opening area OA are not covered by the organic encapsulation layer 320, the second inorganic encapsulation layer 330, and the first touch insulating layer 401 may be in direct contact with the first inorganic encapsulation layer 310 in the second through sixth grooves 2G, 3G, 4G, 5G, and 6G. When the organic encapsulation layer 320 is not arranged in the second through sixth grooves 2G, 3G, 4G, 5G and 6G, moisture may be prevented from proceeding toward the display area DA (refer to FIG. 5) through the organic encapsulation layer 320 and the first organic insulating layer 209, or proceeding of moisture may be reduced.

Figure 15:
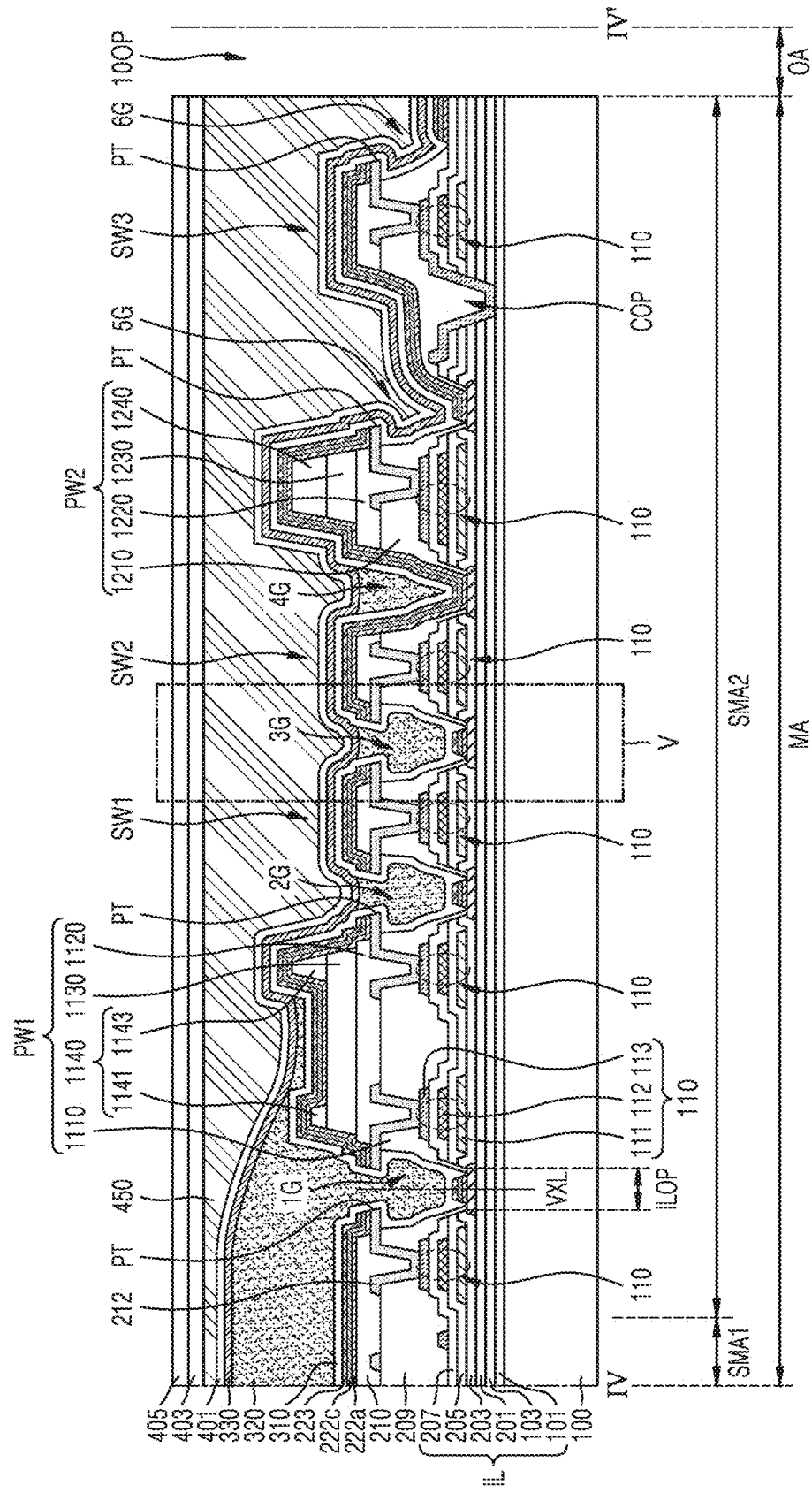
FIG. 15 is a cross-sectional view of a display panel according to another embodiment.
Figure 16:
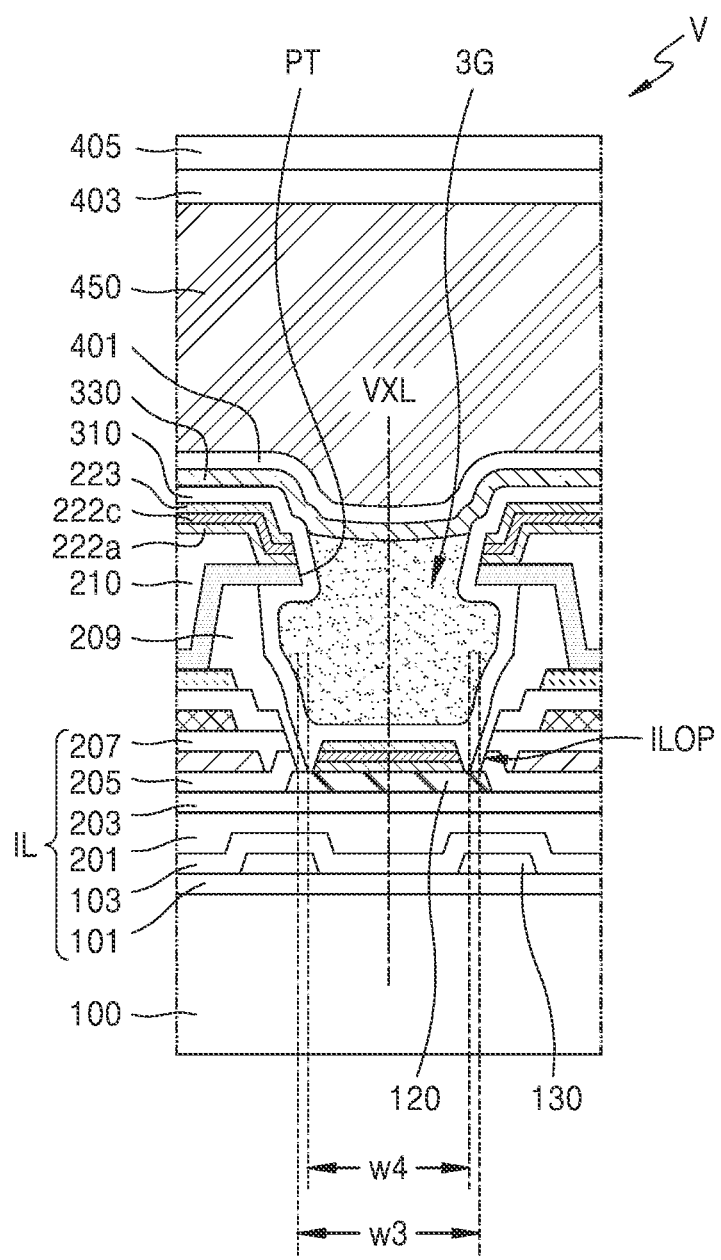
FIG. 16 is an enlarged view of a display panel according to an embodiment, which corresponds to a region V of FIG. 15.

FIG. 15 is a cross-sectional view of a display panel according to another embodiment, and FIG. 16 is an enlarged view of a display panel according to an embodiment, which corresponds to a region V of FIG. 15.

The first through sixth grooves 1G, 2G, 3G, 4G, 5G and 6G described above with reference to FIGS. 7 through 14 are arranged on the plurality of inorganic insulating layers IL. However, embodiments are not limited thereto. In another embodiment, referring to FIG. 15, the plurality of inorganic insulating layers IL may further include an inorganic opening ILOP that overlaps the first through sixth grooves 1G, 2G, 3G, 4G, 5G, and 6G.

Referring to FIGS. 15 and 16, for example, portions of the gate insulating layer 203, the first interlayer insulating layer 205, and the second interlayer insulating layer 207 of the plurality of inorganic insulating layers IL may be etched so that the inorganic opening ILOP may be formed. In other words, an opening of the gate insulating layer 203, an opening of the first interlayer insulating layer 205, and an opening of the second interlayer insulating layer 207 may overlap each other so that the inorganic opening ILOP may be formed.

A lower layer 120 may be positioned directly under the inorganic opening ILOP. The lower layer 120 may be positioned on the buffer layer 201 and may be formed together in the same process as the semiconductor layer A1 (refer to FIG. 6) described with reference to FIG. 6. The lower layer 120 may include the same material as the semiconductor layer A1, for example, a silicon-based semiconductor material. Like in the grooves G (refer to FIG. 7) and the inorganic opening ILOP, the lower layer 120 may have a closed loop shape that surrounds the opening area OA.

The lower layer 120 may function as an etch stopper in a process of forming inorganic openings ILOP. Thus, a bottom surface of the inorganic openings ILOP may correspond to the upper surface of the lower layer 120.

In an embodiment, as shown in FIG. 16, a lower metal pattern 130 that overlaps a boundary of the inorganic openings ILOP may be formed. For example, the lower metal pattern 130 may be arranged between the first barrier layer 101 and the second barrier layer 103. In an embodiment, the lower metal pattern 130 may be arranged on the same layer as a lower metal layer for preventing light emitted from a component 70 (refer to FIG. 2) or external light from reaching the thin film transistor (TFT) of the sub-pixel circuit PC (refer to FIG. 4) and may include the same material.

The inorganic opening ILOP may be etched deeper than the center of the inorganic opening ILOP at both-side edges of the inorganic opening ILOP. The lower metal pattern 130 may be configured in such a way that both-side boundary of the inorganic opening ILOP may pass through the first barrier layer 101 and may prevent the substrate 100 from being exposed.

In an embodiment, a width w3 of the inorganic opening ILOP may be largerthan a width w4 of an opening of the first organic insulating layer 209. Thus, an inner surface of the inorganic opening ILOP may be covered by the first organic insulating layer 209.

At least portions of the plurality of inorganic insulating layers IL may include different inorganic insulating materials. The plurality of inorganic insulating layers IL including different inorganic insulating materials may be etched, and the inner surface of the inorganic opening ILOP may be roughly formed. In a process of forming the third metal layer 113 of the metal dummy stack 110, stringers of the third metal layer 113 may be formed on the rough inner surface of the inorganic opening ILOP. The first organic insulating layer 209 may cover the inner surface of the inorganic opening ILOP in which the stringers are formed, thereby preventing or reducing generation of cracks in the first inorganic encapsulation layer 310.

At least one of the grooves G may include a tip PT. In an embodiment, as shown in FIG. 15, the first groove 1G, the second groove 2G, the third groove 3G, the fifth groove 5G, and the sixth groove 6G may include at least one tip PT. For example, the first groove 1G may have a pair of tips PT that are located at both sides of the first groove 1G with respect to a virtual vertical line VXL passing through the center of the first groove 1G. As in the first groove 1G, corresponding one of the second groove 2G and the third groove 3G may also have a pair of tips PT located at both sides of the second groove 2G and the third groove 3G with respect to a virtual vertical line passing through the center of each of the second groove 2G and the third groove 3G. On the other hand, each of the fifth groove 5G and the sixth groove 6G may include one tip PT located in the first sub-middle area SMA1.

The fourth groove 4G may not include the tip PT. For example, a fourth opening pattern 212OP4 (refer to FIG. 7) of the metal pattern layer 212 may overlap the fourth groove 4G, and a boundary between both sides of the fourth groove 4G may be arranged closer to a virtual vertical line passing through the center of the fourth groove 4G than a boundary between both sides of the fourth opening pattern 212OP4. Thus, an inner surface of the fourth opening 209OP4 (refer to FIG. 7) of the first organic insulating layer 209 may be smoothly connected to an inner surface of the fourth opening 210OP4 (refer to FIG. 8) of the second organic insulating layer 210.

Portions of layers included in the organic light-emitting diode OLED (refer to FIG. 6), for example, the first and second functional layers 222a and 222c that are organic material layers may be disconnected by the grooves G including the tip PT. The second electrode 223 may be disconnected or separated by the grooves G including the tip PT.

In this regard, FIG. 15 illustrates that the first and second functional layers 222a and 222c and the second electrode 223 are disconnected and separated by the tips PT of the first groove 1G, the second groove 2G, the third groove 3G, the fifth groove 5G, and the sixth group 6G. On the other hand, the first and second functional layers 222a and 222c and the second electrode 223 may not be disconnected by the fourth groove 4G but may be continuously formed.

A metal dummy stack 110 may be arranged in the vicinity of the grooves G. For example, the metal dummy stack 110 may be arranged at both sides of the grooves G. The metal dummy stack 110 that is a kind of mound may be configured to increase the depth of the grooves G. In an embodiment, FIG. 15 illustrates that the metal dummy stack 110 includes three metal layers overlapping each other with the insulating layer therebetween, for example, the first through third metal layers 111, 112, and 113.

The first through third metal layers 111, 112, and 113 may be positioned on the same layer as electrodes of the first thin film transistor T1 and the storage capacitor Cst described above with reference to FIG. 6 and may include the same material. For example, the first metal layer 111 may be positioned on the same layer as the gate electrode GE (refer to FIG. 6), and may include the same material. The second metal layer 112 may be positioned on the same layer as the upper electrode CE2 (refer to FIG. 6) of the storage capacitor Cst, and may include the same material. The third metal layer 113 may be positioned on the same layer as the first electrode layer 160 including connection nodes and the bypass portion DL-C2 of the data lines DL, and may include the same material.

In an embodiment, the sixth groove 6G may have an opening COP formed by etching a portion of at least one inorganic insulating layer of the plurality of inorganic insulating layers IL. In this regard, FIG. 15 illustrates that portions of the second barrier layer 103, the buffer layer 201, the gate insulating layer 203, the first interlayer insulating layer 205 and the second interlayer insulating layer 207 among the plurality of inorganic insulating layers IL are etched so that the opening COP may be formed. However, embodiments are not limited thereto. In this case, one of a plurality of metal layers including in the metal dummy stack 110 may extend to cover the opening COP.

In an embodiment, the organic encapsulation layer 320 may be configured to bury the tips PT between the first partition wall PW1 and the second partition wall PW2. For example, a pair of tips PT arranged at both sides of each of the second groove 2G and the third groove 3G may be sufficiently covered by the organic encapsulation layer 320 up to upper surfaces of the pair of tips PT.

The first partition wall PW1 may include a plurality of protrusions so as to control the flow of monomer when the organic encapsulation layer 320 is formed. In an embodiment, FIG. 15 illustrates that the first partition wall PW1 includes first and second protrusions 1141 and 1143 that are spaced apart from each other. In an embodiment, the height of the first partition wall PW1 may be asymmetrically formed. For example, the height of the first protrusion 1141 may be smaller than the height of the second protrusion 1143 so that a margin for an inkjet printing process may be secured. The second protrusion 1143 may protrude onto the organic encapsulation layer 320 to disconnect or separate the organic encapsulation layer 320. On the second protrusion 1143, a portion of the second inorganic encapsulation layer 330 may be in direct contact with a portion of the first inorganic encapsulation layer 310.

Figure 17:
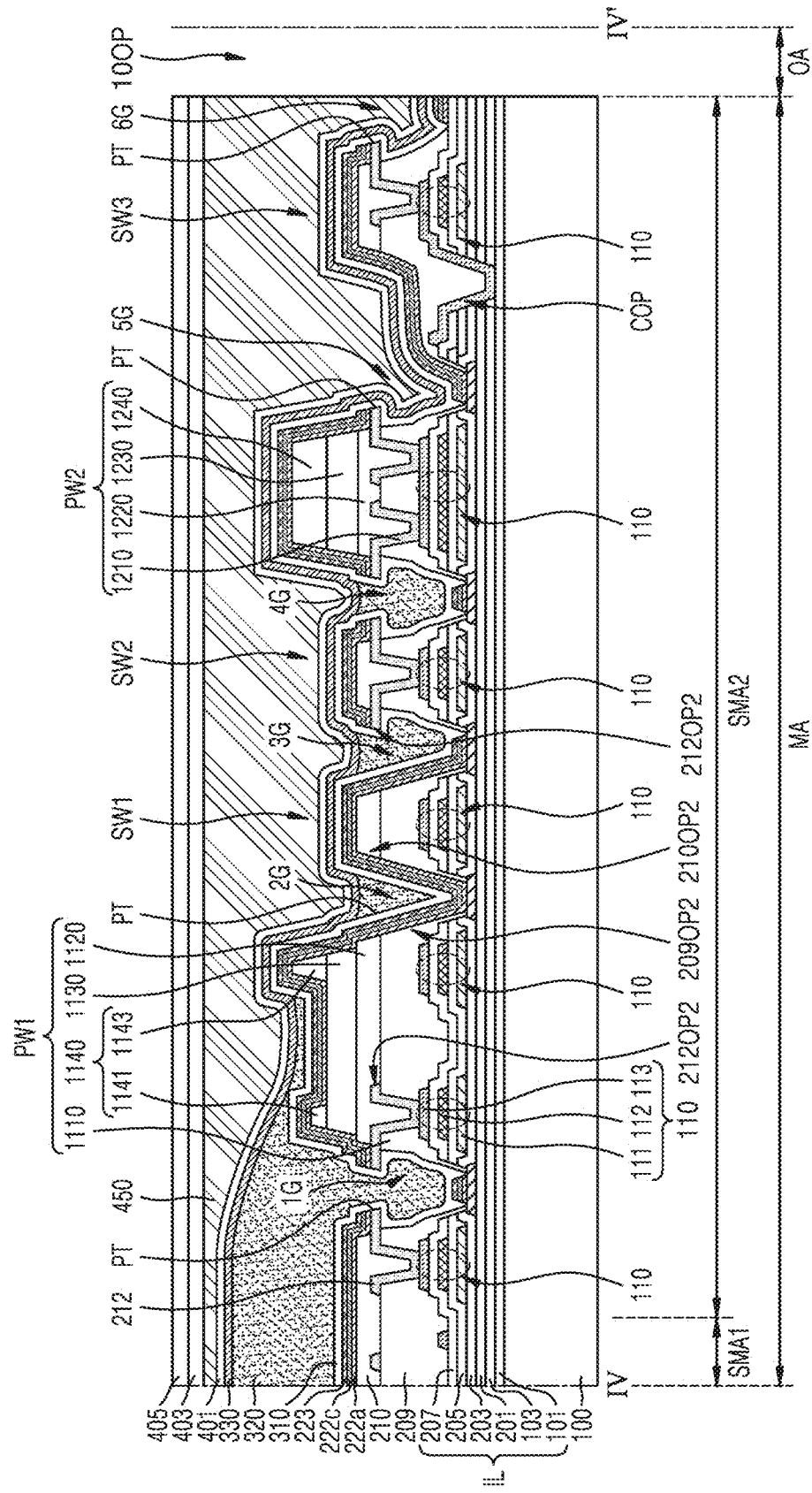
FIGS. 17 and 18 are cross-sectional views of display panels according to other embodiments.
Figure 18:
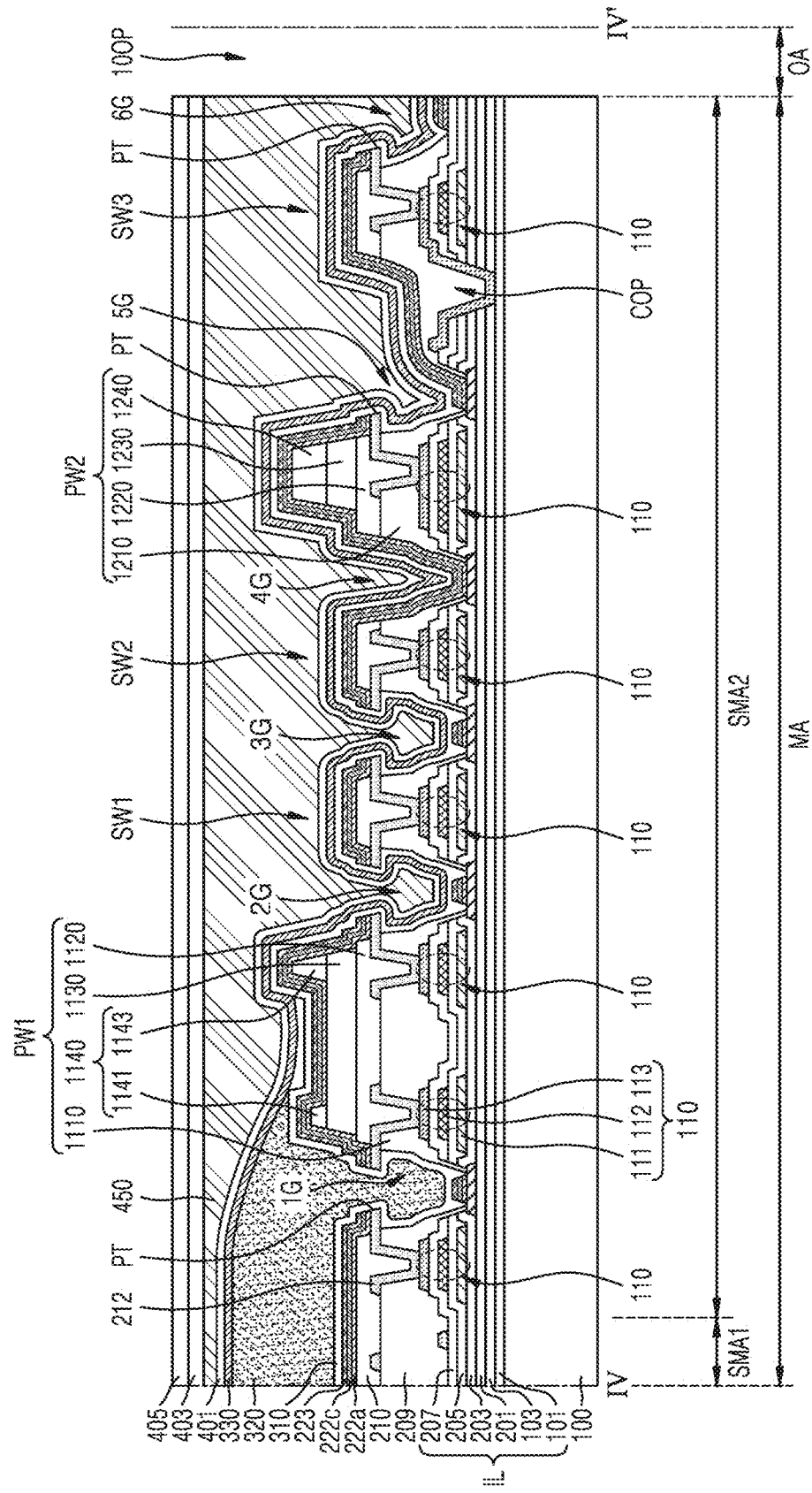

FIGS. 17 and 18 are cross-sectional views of display panels according to other embodiments.

Referring to FIG. 17, a second opening 212OP2 of the metal pattern layer 212 may overlap the second groove 2G and the third groove 3G. For example, a boundary between both sides of the second opening 209OP2 of the first organic insulating layer 209 for defining a boundary of the second groove 2G may be closer to a virtual vertical line passing through the center of the second groove 2G than a boundary between both sides of the second opening pattern 212OP2 of the metal pattern layer 212. Thus, the second opening 209OP2 of the first organic insulating layer 209 and the second opening 210OP2 of the second organic insulating layer 210 may form an inner surface of the second groove 2G that succeeds smoothly.

Similarly, a boundary of one side of the third groove 3G may be closer to a virtual vertical line passing through the center of the third groove 3G than a boundary of one side of the second opening pattern 212OP2 of the metal pattern layer 212. On the other hand, a boundary of the other side of the third groove 3G may be farther from the virtual vertical line passing through the center of the third groove 3G than a boundary of the other side of the second opening pattern 212OP2 of the metal pattern layer 212. Thus, the third groove 3G may include one tip PT that protrudes toward the center of the third groove 3G.

Because both sides of the second groove 2G and one side of the third groove 3G do not include the tip PT, the position of the organic encapsulation layer 320 may be easily monitored.

Each of the first groove 1G and the fourth groove 4G may include a pair of tips PT protruding toward the center of corresponding one of the first groove 1G and the fourth groove 4G, and each of the fifth groove 5G and the sixth groove 6G may include one tip PT protruding toward the center of corresponding one of the fifth groove 5G and the sixth groove 6G. Thus, the first and second functional layers 222a and 222c and the second electrode 223 arranged on the bottom surface of each of the first groove 1G, the third groove 3G, the fourth groove 4G, the fifth groove 5G, and the sixth groove 6G may be discontinuous with the first and second functional layers 222a and 222c and the second electrode 223 placed on each tip PT.

Referring to FIG. 18, the organic encapsulation layer 320 may not exceed the first partition wall PW1. For example, the organic encapsulation layer 320 may be configured to cover the first groove 1G but may be configured not to cover the second through sixth grooves 2G, 3G, 4G, 5G, and 6G located between the first partition wall PW1 and the opening area OA. When the second through sixth grooves 2G, 3G, 4G, 5G and 6G located between the first partition wall PW1 and the opening area OA are not covered by the organic encapsulation layer 320, the second inorganic encapsulation layer 330, and the first touch insulating layer 401 may be in direct contact with the first inorganic encapsulation layer 310 in the second through sixth grooves 2G, 3G, 4G, 5G, and 6G. When the organic encapsulation layer 320 is not arranged in the second through sixth grooves 2G, 3G, 4G, 5G and 6G, moisture may be prevented from proceeding toward the display area DA (refer to FIG. 5) through the organic encapsulation layer 320 and the first organic insulating layer 209, or proceeding of moisture may be reduced.

According to one or more embodiments described above, a display panel in which display elements may be prevented from being damaged by external impurities such as moisture introduced through an opening area and cracks may be prevented from occurring in a middle area in the vicinity of the opening area, may be implemented. Of course, the scope of the present disclosure is not limited by these effects.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope as defined by the following claims.

What is claimed is:

1. A display panel comprising:
   a substrate including an opening, a display area surrounding the opening, and a middle area arranged between the opening and the display area;
   a plurality of inorganic insulating layers arranged on the substrate;
   a first partition wall and a second partition wall arranged in the middle area and spaced apart from each other in a direction toward the opening; and
   a plurality of grooves arranged in the middle area and exposing portions of the plurality of inorganic insulating layers,
   wherein each of the plurality of grooves includes a metal dummy stack arranged at both sides of each of the plurality of grooves based on a virtual vertical line passing through a center of the groove and including a plurality of metal layers.

2. The display panel of claim 1, further comprising a thin film transistor arranged on the substrate and comprising a silicon-based semiconductor layer,
   wherein one of the plurality of metal layers includes a same material as a gate electrode of the thin film transistor.

3. The display panel of claim 1, further comprising a first electrode layer arranged on the plurality of inorganic insulating layers;
   a first organic insulating layer arranged on the first electrode layer; and
   a second electrode layer arranged on the first organic insulating layer,
   wherein a plurality of opening patterns overlapping the plurality of grooves are defined in the second electrode layer.

4. The display panel of claim 3, wherein the plurality of grooves include two or more grooves arranged between the first partition wall and the second partition wall, and
   both sides of a first groove that is one of the two or more grooves is arranged farther from a center of the first groove than both sides of a first opening pattern overlapping the first groove, and
   both sides of a second groove that is one of the two or more grooves is arranged closer from a center of the second groove than both sides of a second opening pattern overlapping the second groove.

5. The display panel of claim 4, wherein, based on a virtual vertical line passing through a center of a third groove that is one of the two or more grooves, one side of a third groove that is one of the two or more grooves is arranged farther from a center of the third groove than one side of a third opening pattern overlapping the third groove, and
   other side of the third groove is arranged closer to the center of the third groove than other side of the third opening pattern.

6. The display panel of claim 3, wherein the plurality of grooves include a fourth groove overlapping the opening and a fifth groove arranged between the second partition wall and the fourth groove, and
   a boundary of the fourth groove is arranged farther from a center of the fourth groove than a boundary of a fourth opening pattern overlapping the fourth groove, and
   one side close to the second partition wall of the fifth groove is arranged farther from a center of the fifth groove than one side close to the second partition wall of a fifth opening pattern overlapping the fifth groove, and
   other side close to the opening of the fifth groove is arranged closer to the center of the fifth groove than other side close to the opening of the fifth opening pattern.

7. The display panel of claim 3, wherein the first organic insulating layer is disconnected from a metal contact region in which the metal dummy stack and the second electrode layer are in contact with each other.

8. The display panel of claim 1, wherein a second opening between the opening and the second partition wall is formed in the plurality of inorganic insulating layers, and
   one metal layer of a metal dummy stack adjacent to the opening extends to cover the second opening.

9. The display panel of claim 1, further comprising an encapsulation layer arranged on the first partition wall and the second partition wall and including at least one inorganic encapsulation layer and an organic encapsulation layer,
   wherein the organic encapsulation layer is configured to cover the plurality of grooves arranged between the first partition wall and the second partition wall among the plurality of grooves.

10. The display panel of claim 9, wherein at least portions of the plurality of grooves arranged between the first partition wall and the second partition wall includes a tip protruding toward a center of each groove, and
    the organic encapsulation layer is configured to bury the tip.

11. The display panel of claim 9, wherein the at least one inorganic encapsulation layer includes:
    a first inorganic encapsulation layer arranged under the organic encapsulation layer; and
    a second inorganic encapsulation layer arranged on the organic encapsulation layer,
    wherein a first portion of the first inorganic encapsulation layer and a first portion of the second inorganic encapsulation layer are in direct contact with each other on the first partition wall, and
    a second portion of the first inorganic encapsulation layer and a second portion of the second inorganic encapsulation layer are in direct contact with each other on the second partition wall.

12. The display panel of claim 1, wherein the first partition wall includes a first protrusion and a second protrusion having a greater height than the first protrusion.

13. A display panel comprising:
a substrate including a first opening, a display area surrounding the first opening, and a middle area arranged between the first opening and the display area;
a plurality of inorganic insulating layers arranged on the substrate and having a plurality of second openings arranged in the middle area;
a first partition wall and a second partition wall arranged in the middle area and spaced apart from each other in a direction toward the first opening;
a plurality of grooves arranged in the middle area and overlapping the plurality of second openings; and
a plurality of lower layers arranged in the middle area and positioned under the plurality of grooves, respectively,
wherein each of the plurality of grooves comprises a metal dummy stack arranged at both sides of each of the plurality of grooves based on a virtual vertical line passing through a center of the groove and comprising a plurality of metal layers, and
an upper surface of each of the plurality of lower layers corresponds to a bottom surface of each of the plurality of grooves.

14. The display panel of claim 13, further comprising a thin film transistor arranged on the substrate and comprising a silicon-based semiconductor layer,
wherein the lower layer includes a same material as the silicon-based semiconductor layer.

15. The display panel of claim 14, wherein one of the plurality of metal layers includes a same material as a gate electrode of the thin film transistor.

16. The display panel of claim 13, further comprising:
a first barrier layer arranged on the substrate;
a second barrier layer arranged on the first barrier layer; and
a lower metal pattern arranged between the first barrier layer and the second barrier layer,
wherein the lower metal pattern overlaps a boundary of the plurality of openings.

17. The display panel of claim 13, further comprising a first electrode layer arranged on the plurality of inorganic insulating layers;
a first organic insulating layer arranged on the first electrode layer; and
a second electrode layer arranged on the first organic insulating layer and having a plurality of opening patterns overlapping the plurality of grooves,
wherein the first organic insulating layer is configured to cover inner surfaces of the plurality of second openings.

18. The display panel of claim 17, wherein the plurality of grooves include two or more grooves arranged between the first partition wall and the second partition wall, and
both sides of a first groove that is one of the two or more grooves is arranged farther from a center of the first groove than both sides of a first opening pattern overlapping the first groove, and
both sides of a second groove that is one of the two or more grooves is arranged farther closer from a center of the second groove than both sides of a second opening pattern overlapping the second groove.

19. The display panel of claim 18, wherein one side of a third groove that is one of the two or more grooves is arranged farther from a center of the third groove than one side of a third opening pattern overlapping the third groove based on a virtual vertical line passing through a center of the third groove, and
other side of the third groove is arranged closer to the center of the third groove than other side of the third opening pattern.

20. The display panel of claim 17, wherein the plurality of grooves include a fourth groove overlapping the first opening and a fifth groove arranged between the second partition wall and the fourth groove, and
a boundary of the fourth groove is arranged farther from a center of the fourth groove than a boundary of a fourth opening pattern of the plurality of opening patterns overlapping the fourth groove, and
one side close to the second partition wall of the fifth groove is arranged farther from a center of the fifth groove than one side close to the second partition wall of a fifth opening pattern of the plurality of opening patterns overlapping the fifth groove, and
other side close to the opening of the fifth groove is arranged closer to the center of the fifth groove than other side close to the opening of the fifth opening pattern.

21. The display panel of claim 13, further comprising an encapsulation layer arranged on the first partition wall and the second partition wall and comprising at least one inorganic encapsulation layer and organic encapsulation layer,
Wherein the organic encapsulation layer is configured to cover the plurality of grooves arranged between the first partition wall and the second partition wall among the plurality of grooves.

22. The display panel of claim 21, wherein at least portions of the plurality of grooves arranged between the first partition wall and the second partition wall include a tip protruding toward a center of each groove, and
the organic encapsulation layer is configured to bury the tip.

* * * * *